US010913093B2

(12) United States Patent
Chau

(10) Patent No.: US 10,913,093 B2
(45) Date of Patent: Feb. 9, 2021

(54) MICRO-ELECTRO-MECHANICAL SYSTEM PIEZOELECTRIC TRANSDUCER AND METHOD FOR MANUFACTURING THE SAME

(71) Applicant: MEMSEN ELECTRONICS INC, Tianjin (CN)

(72) Inventor: Manhing Chau, Nankai District Tianjin (CN)

(73) Assignee: MEMSEN ELECTRONICS INC., Tianjin (CN)

( * ) Notice: Subject to any disclaimer, the term of this patent is extended or adjusted under 35 U.S.C. 154(b) by 467 days.

(21) Appl. No.: 15/874,233

(22) Filed: Jan. 18, 2018

(65) Prior Publication Data

US 2018/0207681 A1   Jul. 26, 2018

(30) Foreign Application Priority Data

Jan. 20, 2017   (CN) .......................... 2017 1 0044935
Jan. 8, 2018    (CN) .......................... 2018 1 0014708

(51) Int. Cl.
*B06B 1/06*     (2006.01)
*H01L 41/27*    (2013.01)
(Continued)

(52) U.S. Cl.
CPC .......... *B06B 1/0603* (2013.01); *B06B 1/0622* (2013.01); *H01L 27/20* (2013.01); *H01L 41/27* (2013.01); *H01L 41/311* (2013.01)

(58) Field of Classification Search
CPC ..... B06B 1/0603; B06B 1/0622; H01L 27/20; H01L 41/311; H01L 41/27;
(Continued)

(56) References Cited

U.S. PATENT DOCUMENTS 5,623,236 A * 4/1997 Yoshinaga ............... H03H 3/02
                                                    29/25.35
9,862,592 B2 * 1/2018 Cheng ..................... B81B 3/007
(Continued)

FOREIGN PATENT DOCUMENTS

CN   102156012 A   8/2011
CN   104634487 A   5/2015
(Continued)

OTHER PUBLICATIONS

CNIPA First Office Action for corresponding CN Patent Application No. 201810014708.0; dated Mar. 3, 2020.
(Continued)

*Primary Examiner* — Emily P Pham
(74) *Attorney, Agent, or Firm* — Cantor Colburn LLP

(57) ABSTRACT

An MEMS piezoelectric transducer and a method for manufacturing the same are provided. The first substrate includes a first base, at least one conductive layer, a signal processing circuit and/or a driving circuit arranged on a side of the first base, where the signal processing circuit and/or the driving circuit is electrically connected to the at least one conductive layer. The second substrate includes a second base, a first electrode arranged on a side of the second base, and a piezoelectric layer arranged on the first electrode. A side of the first substrate where the at least one conductive layer is arranged is attached and fixed to a side of the second substrate where the first electrode and the piezoelectric layer are arranged. The first electrode and the at least one conductive layer are electrically connected through a conductive through via.

22 Claims, 13 Drawing Sheets

(51) Int. Cl.
   *H01L 27/20* (2006.01)
   *H01L 41/311* (2013.01)
(58) Field of Classification Search
   CPC ......... H01L 41/02–1878; B81B 7/0006; B81B 7/02; B81C 3/001; G01L 1/14; H02N 2/00–188
   See application file for complete search history.

(56) References Cited

U.S. PATENT DOCUMENTS

| | | | |
|---|---|---|---|
| 2005/0262676 A1 | 12/2005 | Kim et al. | |
| 2014/0001584 A1 | 1/2014 | Liu | |
| 2014/0370639 A1 | 12/2014 | Yamaguchi et al. | |
| 2015/0357375 A1* | 12/2015 | Tsai | B81C 1/00246 257/416 |
| 2016/0236931 A1 | 8/2016 | Chau | |
| 2016/0236932 A1 | 8/2016 | Chau | |
| 2017/0156209 A1* | 6/2017 | Wang | H05K 3/303 |
| 2017/0301853 A1* | 10/2017 | Xia | H01L 41/27 |
| 2019/0140158 A1 | 5/2019 | Eid et al. | |
| 2019/0247887 A1* | 8/2019 | Salvia | B06B 1/0622 |

FOREIGN PATENT DOCUMENTS

| | | |
|---|---|---|
| CN | 104655334 A | 5/2015 |
| JP | H08116101 A | 5/1996 |
| TW | 201539812 A | 10/2015 |
| TW | 201539812 A | 10/2016 |

OTHER PUBLICATIONS

Zhang et al, "Analysis and fabrication of a nano-fiber piezoelectric pressure sensor", Transducer and Microsystem Technologies, 10.13873-J.1000-9787; pp. 124-130; dated Jan. 2016.

TW Summary of the First Office Action corresponding to Application No. 107101566; dated Sep. 6, 2018.

* cited by examiner

MICRO-ELECTRO-MECHANICAL SYSTEM PIEZOELECTRIC TRANSDUCER AND METHOD FOR MANUFACTURING THE SAME

CROSS REFERENCE TO RELATED APPLICATION

The present application claims priority under 35 U.S.C. § 119 to Chinese Patent Application No. 201710044935.3, filed on Jan. 20, 2017 with the Chinese State Intellectual Property Office, and Chinese Patent Application No. 201810014708.0, filed on Jan. 8, 2018, the entire contents of which are incorporated herein by reference.

TECHNICAL FIELD

The present disclosure relates to the technical field of semiconductor manufacturing, and particularly to a micro-electro-mechanical system (MEMS) piezoelectric transducer and a method for manufacturing the MEMS piezoelectric transducer.

BACKGROUND

A piezoelectric transducer refers to a transducer manufactured based on a piezoelectric effect of a certain dielectric. The piezoelectric effect includes a direct piezoelectric effect and a converse piezoelectric effect. The piezoelectric transducer based on the direct piezoelectric effect, such as a pressure transducer, outputs an electrical signal under external force, and the electrical signal is analyzed and processed by a signal processing circuit to obtain pressure information. The piezoelectric transducer based on the converse piezoelectric effect, such as a piezoelectric quartz oscillator, generates pressure, sound or the like in response to an electrical signal outputted by a driving circuit, so as to delivery information such as the pressure or the sound to the outside. A micro-electro-mechanical system (MEMS) piezoelectric transducer combines a piezoelectric transducer with a signal processing circuit (or a driving circuit) of the piezoelectric transducer. Due to its advantages such as small size and high accuracy, MEMS piezoelectric transducer has widespread applications.

In conventional technology, the piezoelectric transducer and the signal processing circuit (or the driving circuit) are mostly arranged on separate substrates respectively, and then packaged together or assembled in a circuit board to be connected together, which results in a complicated packaging process, a large size, and a high cost.

The piezoelectric transducer and the signal processing circuit (or the driving circuit) may be arranged on a same substrate in a conventional technology. However, since the manufacturing process of the piezoelectric transducer is quite different from that of the signal processing circuit (or the driving circuit), when the piezoelectric transducer and the signal processing circuit (or the driving circuit) are arranged on the same substrate, the manufacturing process of the piezoelectric transducer can affects performance of the signal processing circuit (or the driving circuit), and/or the manufacturing process of the signal processing circuit (or the driving circuit) may also affects performance of the piezoelectric transducer. This results in poor performance of the MEMS piezoelectric transducer arranged on the same substrate.

In addition, an existing MEMS piezoelectric transducer utilizes either the direct piezoelectric effect or the converse piezoelectric effect, but not both. It becomes desirable to develop a structure and method to integrate piezoelectric transducer and signal processing/driving circuit.

SUMMARY

In view of this, a micro-electro-mechanical system (MEMS) piezoelectric transducer and a method for manufacturing the MEMS piezoelectric transducer are provided according to the present disclosure, to integrate the piezoelectric transducer and a signal processing circuit and/or a driving circuit effectively.

To realize the above objective, the following technical solutions are provided according to the present disclosure.

A method for manufacturing an MEMS piezoelectric transducer is provided, including:

preparing a first substrate including a first base, at least one conductive layer, a signal processing circuit and/or a driving circuit, where the at least one conductive layer, the signal processing circuit and/or the driving circuit are arranged on a side of the first base, and the signal processing circuit and/or the driving circuit is electrically connected to the at least one conductive layer;

preparing a second substrate, where the second substrate includes a second base, a first electrode arranged on a side of the second base, and a piezoelectric layer arranged on the first electrode;

attaching and fixing a side of the first substrate where the at least one conductive layer is arranged to a side of the second substrate where the first electrode and the piezoelectric layer are arranged, where a cavity corresponding to the first electrode is provided between the first substrate and the second substrate;

thinning a side of the second substrate facing away from the first substrate by removing entirely or a part of the second base in a thickness direction; and forming a conductive through via for electrically connecting the first electrode with the at least one conductive layer, to electrically connect the first electrode with the signal processing circuit and/or the driving circuit.

Preferably, a second electrode is arranged on the piezoelectric layer or in the at least one conductive layer, where the second electrode corresponds to the first electrode.

Preferably, the method further includes:

forming a first bonding layer on a surface of the side of the first substrate where the at least one conductive layer is arranged, and/or forming a second bonding layer on a surface of the side of the second substrate where the first electrode and the piezoelectric layer are arranged, and the first substrate and the second substrate are attached and fixed together through the first bonding layer and/or the second bonding layer;

at least one of the first bonding layer and the second bonding layer includes an insulating structure.

Preferably, the forming the conductive through via for electrically connecting the first electrode with the at least one conductive layer includes:

forming a first conductive through via extending from the side of the second substrate facing away from the first substrate to the at least one conductive layer; and forming a second conductive through via extending from the side of the second substrate facing away from the first substrate to the first electrode, where the first conductive through via and the second conductive through via are electrically connected directly, or the first conductive through via and the second conductive through via are electrically connected through a conductive connection structure/layer arranged on the side of the second substrate facing away from the first substrate.

Preferably, before the attaching and fixing the side of the first substrate where the at least one conductive layer is arranged to the side of the second substrate where the first electrode and the piezoelectric layer are arranged, the method further includes:

forming a first opening on the side of the first substrate where the at least one conductive layer is arranged and/or the side of the second substrate where the first electrode and the piezoelectric layer are arranged, so that the first opening forms a cavity between the first substrate and the second substrate after the two substrates are attached and fixed together.

Preferably, the method further includes:

forming a second opening on a side of the first substrate facing away from the second substrate, where a position of the second opening corresponds to a position of the first electrode.

Preferably, the second substrate comprises a base, an insulating layer on a surface of the base and a semiconductor layer on a surface of the insulating layer, the base is the second base, and the method further includes:

forming the first electrode using the semiconductor layer, or forming the first electrode on the semiconductor layer.

Preferably, the method further includes:

forming a third electrode on the side of the first substrate where the at least one conductive layer is arranged, where the third electrode is a self-test electrode, and a position of the self-test electrode corresponds to the position of the first electrode.

Preferably, the method further includes:

forming a third opening extending from the side of the second substrate facing away from the first substrate to the cavity.

A method for manufacturing an MEMS piezoelectric transducer is provided, including:

preparing a first substrate, where the first substrate includes a first base, at least one conductive layer, a signal processing circuit and/or a driving circuit, where the at least one conductive layer, the signal processing circuit and/or the driving circuit are arranged on a side of the first base, and the signal processing circuit and/or the driving circuit is electrically connected to the at least one conductive layer;

preparing a second substrate, where the second substrate includes a second base;

attaching and fixing a side of the first substrate where the at least one conductive layer is arranged to a side of the second substrate, where a cavity is arranged in a region between the first substrate and the second substrate;

thinning a side of the second substrate facing away from the first substrate by removing entirely or a part of the second base in a thickness direction;

forming a piezoelectric capacitor on the side of the second substrate facing away from the first substrate, where the piezoelectric capacitor includes a first electrode, a second electrode and a piezoelectric layer arranged between the first electrode and the second electrode, and a position of the first electrode corresponds to a position of the cavity; and forming a conductive through via for electrically connecting the first electrode with the at least one conductive layer, to electrically connect the piezoelectric capacitor with the signal processing circuit and/or the driving circuit.

Preferably, the method further includes:

forming a first bonding layer on a surface of the side of the first substrate where the at least one conductive layer is arranged, and/or forming a second bonding layer on a surface of a side of the second substrate, and the first substrate and the second substrate are attached and fixed together through the first bonding layer and/or the second bonding layer, and at least one of the first bonding layer and the second bonding layer includes an insulating structure.

Preferably, the forming the conductive through via for electrically connecting the first electrode with the at least one conductive layer includes:

forming a first conductive through via extending from a side of the second substrate where the first electrode is arranged to the at least one conductive layer; and forming a second conductive through via extending from the side of the second substrate where the first electrode is arranged to the first electrode, where the first conductive through via and the second conductive through via are electrically connected directly, or the first conductive through via and the second conductive through via are electrically connected through a conductive connection layer/structure arranged on the side of the second substrate facing away from the first substrate.

Preferably, before the attaching and fixing the side of the first substrate where the at least one conductive layer is arranged to the side of the second substrate, the method further includes:

forming a first opening in a region on the side of the first substrate where the at least one conductive layer is arranged and/or the side of the second base, so that the first opening forms a cavity between the first substrate and the second substrate after the two substrates are attached and fixed together.

Preferably, the method further includes:

forming a second opening on a side of the first substrate facing away from the second substrate, where a position of the second opening corresponds to the position of the first electrode.

Preferably, the second substrate includes a base, an insulating layer on a surface of the base and a semiconductor layer on a surface of the insulating layer, and the base is the second base, where the attaching and fixing the side of the first substrate where the at least one conductive layer is arranged to the side of the second substrate includes:

attaching and fixing the side of the first substrate where the at least one conductive layer is arranged to a side of the second substrate where the insulating layer and the semiconductor layer are arranged.

Preferably, the method further includes:

forming a third electrode on the side of the first substrate where the at least one conductive layer is arranged, where the third electrode is a self-test electrode, and a position of the self-test electrode corresponds to the position of the first electrode.

Preferably, the method further includes:

forming a third opening extending from the side of the second substrate facing away from the first substrate to the cavity.

An MEMS piezoelectric transducer is provided, including:

a first substrate and a second substrate which are attached and fixed together, where the first substrate includes a first base, at least one conductive layer, a signal processing circuit and/or a driving circuit, where the at least one conductive layer, the signal processing circuit and/or the driving circuit are arranged on a side of the first base, and the signal processing circuit and/or the driving circuit is electrically connected to the at least one conductive layer;

the second substrate includes a first electrode and a piezoelectric layer arranged on the first electrode;

a side of the first substrate where the at least one conductive layer is arranged is attached and fixed to a side of the second substrate where the first electrode and the piezoelectric layer are arranged, a cavity corresponding to the first electrode is provided between the first substrate and the second substrate; and a conductive through via for electrically connecting the first electrode with the at least one conductive layer is provided to electrically connect the first electrode with the signal processing circuit and/or the driving circuit.

Preferably, the first substrate further includes a first bonding layer arranged on a surface of a side of the first substrate where the at least one conductive layer is arranged, and/or the second substrate further includes a second bonding layer arranged on a surface of a side of the second substrate where the first electrode and the piezoelectric layer are arranged, where the first substrate and the second substrate are attached and fixed together through the first bonding layer and/or the second bonding layer, and at least one of the first bonding layer and the second bonding layer includes an insulating structure.

Preferably, the conductive through via includes a first conductive through via and a second conductive through via, where the first conductive through via extends from a side of the second substrate facing away from the first substrate to the at least one conductive layer, and the second conductive through via extends from the side of the second substrate facing away from the first substrate to the first electrode; and the first conductive through via and the second conductive through via are electrically connected directly, or the first conductive through via and the second conductive through via are electrically connected through a conductive connection layer/structure arranged on the side of the second substrate facing away from the first substrate.

Preferably, a first opening is provided on the side of the first substrate where the at least one conductive layer is arranged and/or on the side of the second substrate where the first electrode and the piezoelectric layer are arranged, and the first opening between the first substrate and the second substrate forms a cavity.

Preferably, a second opening is provided on a side of the first substrate facing away from the second substrate, where a position of the second opening corresponds to a position of the first electrode.

Preferably, a third electrode is provided on the side of the first substrate where the at least one conductive layer is arranged, the third electrode is a self-test electrode, and a position of the third electrode corresponds to the position of the first electrode.

Preferably, a third opening is provided on a side of the second substrate facing away from the first substrate, and the third opening extends from the side of the second substrate facing away from the first substrate to the cavity.

Preferably, the second substrate comprises a second base, and the first electrode is arranged on a side of the second base. The distance between the second base and the first substrate is greater than the distance between the piezoelectric layer and the first substrate.

Preferably, the second base in a region of the second substrate corresponding to the first electrode has a zero or partial thickness.

An MEMS piezoelectric transducer is provided, including:

a first substrate and a second substrate which are attached and fixed together, where the first substrate includes a first base, at least one conductive layer, a signal processing circuit and/or a driving circuit, where the at least one conductive layer, the signal processing circuit and/or the driving circuit are arranged on a side of the first base, and the signal processing circuit and/or the driving circuit is electrically connected to the at least one conductive layer;

a side of the second substrate is attached and fixed to a side of the first substrate where the at least one conductive layer is arranged;

a cavity is provided between the first substrate and the second substrate;

a piezoelectric capacitor is arranged on a side of the second base facing away from the first substrate, where the piezoelectric capacitor includes a first electrode, a second electrode and a piezoelectric layer arranged between the first electrode and the second electrode, and a position of the first electrode corresponds to a position of the cavity; and a conductive through via for electrically connecting the first electrode with the at least one conductive layer is provided to electrically connect the piezoelectric capacitor with the signal processing circuit and/or the driving circuit.

Preferably, the first substrate further includes a first bonding layer arranged on a surface of the side of the first substrate where the at least one conductive layer is arranged, and/or the second substrate further includes a second bonding layer on a surface of the side of the second substrate, where the first substrate and the second substrate are attached and fixed together through the first bonding layer and/or the second bonding layer, and at least one of the first bonding layer and the second bonding layer includes an insulating structure.

Preferably, the conductive through via includes a first conductive through via and a second conductive through via, where the first conductive through via extends from the side of the second substrate facing away from the first substrate to the at least one conductive layer, and the second conductive through via extends from the side of the second substrate facing away from the first substrate to the first electrode; and the first conductive through via and the second conductive through via are electrically connected directly, or the first conductive through via and the second conductive through via are electrically connected through a conductive connection layer/structure arranged on the side of the second substrate facing away from the first substrate.

Preferably, a first opening is provided on the side of the first substrate where the at least one conductive layer is arranged and/or the side of the second substrate facing the first substrate, and the first opening between the first substrate and the second substrate forms the cavity.

Preferably, a second opening is provided on the side of the first substrate facing away from the second substrate, and a position of the second opening corresponds to the position of the first electrode.

Preferably, a third electrode is provided on the side of the first substrate where the at least one conductive layer is arranged, the third electrode is a self-test electrode, and a position of the third electrode corresponds to the position of the first electrode.

Preferably, a third opening is provided on the side of the second substrate facing away from the first substrate, where the third opening extends from the side of the second substrate facing away from the first substrate to the cavity.

Preferably, the second substrate comprises a second base. The distance between the second base and the first substrate is less than the distance between the piezoelectric capacitor and the first substrate.

Compared with the conventional technology, the technical solutions provided in the present disclosure have following advantages.

In the MEMS piezoelectric transducer and the method for manufacturing the MEMS piezoelectric transducer provided in the present disclosure, the first substrate includes the first base, at least one conductive layer, and the signal processing circuit and/or the driving circuit. The at least one conductive layer, the signal processing circuit and/or the driving circuit are arranged on a side of the first base. The signal processing circuit and/or the driving circuit is electrically connected to the conductive layer. The second substrate includes the second base, the first electrode arranged on a side of the second base and the piezoelectric layer arranged on the first electrode. The side of the first substrate where the conductive layer is arranged is attached and fixed to the side of the second substrate where the first electrode and the piezoelectric layer are arranged, and the cavity corresponding to the first electrode is formed between the first substrate and the second substrate. The first electrode is electrically connected to the conductive layer through the conductive through via, such that the signal processing circuit may receive an electrical signal outputted by the deformed first electrode, and the driving circuit may input an electrical signal to the first electrode to deform the first electrode and the piezoelectric layer.

Based on this, a stacked structure of the first substrate and the second substrate is formed by attaching and fixing the side of the first substrate where the conductive layer is arranged to the side of the second substrate where the first electrode and the piezoelectric layer are arrange, thereby not only solving the problem of poor performance of the MEMS piezoelectric transducer resulting from sequentially forming the first electrode, the piezoelectric layer, the signal processing circuit and/or the driving circuit and the like on a same base, but also easily forming the cavity between the first substrate and the second substrate to provide space for deformation of the first electrode and the piezoelectric layer, which reduces process difficulty. Therefore, materials and manufacturing processes of the second base, the first electrode and the piezoelectric layer can be selected widely, and the formed piezoelectric transducer has high sensitivity.

In another MEMS piezoelectric transducer and a method for manufacturing the MEMS piezoelectric transducer provided in the present disclosure, the first substrate includes the first base, at least one conductive layer, and the signal processing circuit and/or the driving circuit. The conductive layer, the signal processing circuit and/or the driving circuit are arranged on a side of the first base. The signal processing circuit and/or the driving circuit is electrically connected to the conductive layer. The second substrate includes the second base. The side of the second substrate is attached and fixed to the side of the first substrate where the conductive layer is arranged, and the cavity corresponding to the first electrode is formed between the first substrate and the second substrate. The piezoelectric layer and the first electrode arranged on the surface of the piezoelectric layer are arranged on the side of the second base facing away from the first substrate. The first electrode is electrically connected to the conductive layer via the conductive through via. Therefore, the signal processing circuit may receive an electrical signal outputted by the deformed first electrode, and the driving circuit may input an electrical signal to the first electrode to deform the piezoelectric capacitor.

Based on this, a stacked structure of the first substrate and the second substrate is formed by attaching and fixing the side of the first substrate where the conductive layer is arranged to the side of the second base, and forming the piezoelectric layer and the first electrode arranged on the surface of the piezoelectric layer on the side of the second base facing away from the first substrate. The cavity between the first substrate and the second substrate is formed easily, which provides space for deformation of the first electrode and the piezoelectric layer. Also, in the method provided in the present disclosure, a new base material can be provided on which to form the piezoelectric capacitor (including the first electrode, the piezoelectric layer, the second electrode and the like), thereby solving the problem of poor performance of the MEMS piezoelectric transducer resulting from limited material choice due to the constraints from signal processing circuit and/or the driving circuit, and reducing process difficulty. Therefore, materials and manufacturing processes of the second base, the first electrode and the piezoelectric layer can be selected freely, and the formed piezoelectric transducer has high sensitivity.

BRIEF DESCRIPTION OF THE DRAWINGS

In order to illustrate the technical solutions according to the embodiments of the present disclosure or conventional technology more clearly, the drawings required in description of the embodiments of the present disclosure or conventional technology are introduced simply below. Apparently, the drawings in the following descriptions are only some embodiments of the present disclosure, and other drawings may be obtained by those skilled in the art based on the provided drawings without creative work.

DETAILED DESCRIPTION OF THE EMBODIMENTS

The technical solutions according to the embodiments of the present disclosure will be described clearly and completely as follows in conjunction with the drawings in the embodiments of the present disclosure. It is apparent that the described embodiments are only a part rather than all of the embodiments according to the present disclosure. Any other embodiments obtained by those skilled in the art based on the embodiments in the present disclosure without any creative work fall within the protection scope of the present disclosure.

Figure 1:
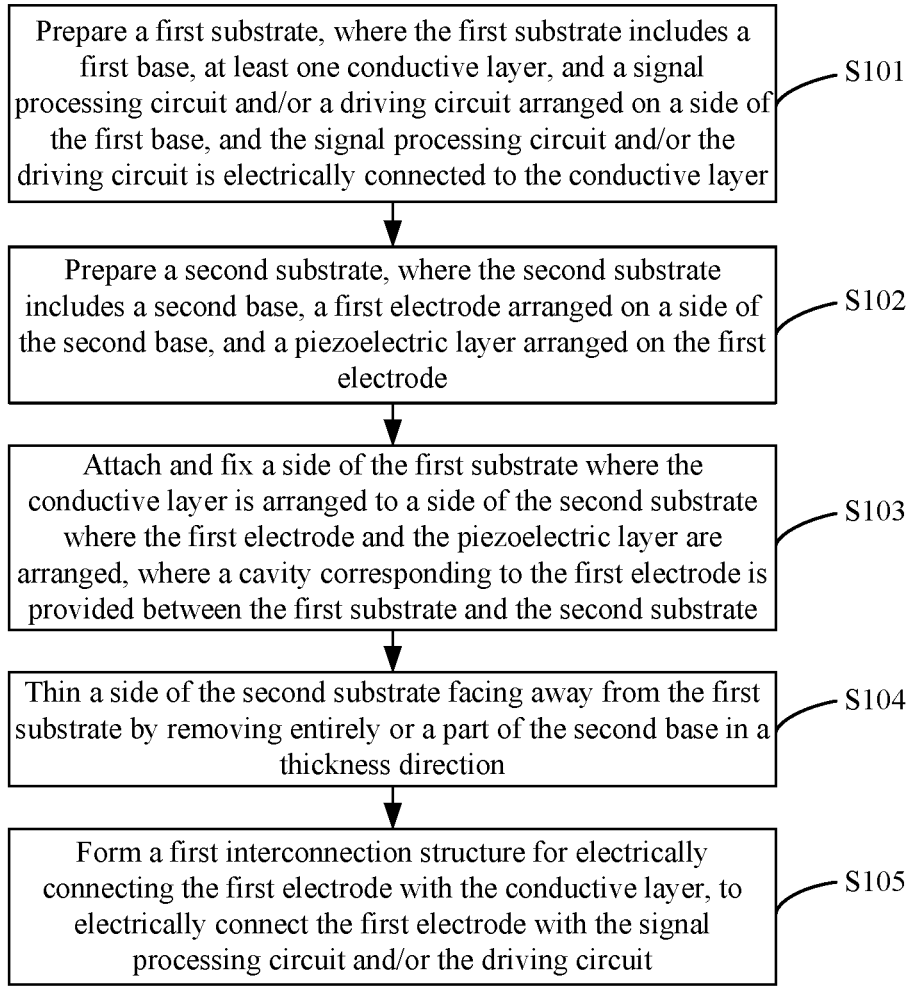
FIG. 1 is a flowchart of a method for manufacturing an MEMS piezoelectric transducer according to an embodiment of the present disclosure.

A method for manufacturing an MEMS piezoelectric transducer is provided according to an embodiment of the present disclosure. As shown in FIG. 1, the method includes steps S101 to S105.

In step S101, a first substrate is prepared. The first substrate includes a first base, at least one conductive layer, a signal processing circuit and/or a driving circuit. The at least one conductive layer, the signal processing circuit and/or the driving circuit are arranged on a side of the first base. The signal processing circuit and/or the driving circuit is electrically connected to the conductive layer.

In step S102, a second substrate is prepared. The second substrate includes a second base, a first electrode arranged on a side of the second base and a piezoelectric layer arranged on the first electrode.

In step S103, a side of the first substrate where the conductive layer is arranged is attached and fixed to a side of the second substrate where the first electrode and the piezoelectric layer are arranged. A cavity corresponding to the first electrode is provided between the first substrate and the second substrate.

In step S104, a side of the second substrate facing away from the first substrate is thinned by removing entirely or a part of the second base in a thickness direction.

In step S105, a conductive through via for electrically connecting the first electrode with the conductive layer is formed, to electrically connect the first electrode with the signal processing circuit and/or the driving circuit.

The first electrode is electrically connected to the conductive layer through the conductive through via, and the conductive layer is electrically connected to the signal processing circuit and/or the driving circuit. Therefore, the first electrode can be electrically connected to the signal processing circuit and/or the driving circuit. Based on this, the signal processing circuit may receive an electrical signal outputted by the deformed first electrode, and the driving circuit may input an electrical signal to the first electrode to deform the first electrode and the piezoelectric layer, so as to deliver information such as pressure or sound to the outside.

In the embodiment, a stacked structure of the first substrate and the second substrate is formed by attaching and fixing the side of the first substrate where the conductive layer is arranged to the side of the second substrate where the first electrode and the piezoelectric layer are arranged, thereby not only solving the problem of poor performance of the MEMS piezoelectric transducer resulted from the constraints of forming the first electrode, the piezoelectric layer and the signal processing circuit and/or the driving circuit sequentially on a same base, but also easily forming the cavity between the first substrate and the second substrate to provide space for deformation of the first electrode and the piezoelectric layer, which reduces process difficulty. Therefore, materials and manufacturing processes of the second base, the first electrode and the piezoelectric layer can be selected freely, and the formed piezoelectric transducer has high sensitivity and performance.

A process of manufacturing the MEMS piezoelectric transducer is described in conjunction with sectional structures shown in FIG. 2 to FIG. 10.

Figure 2:
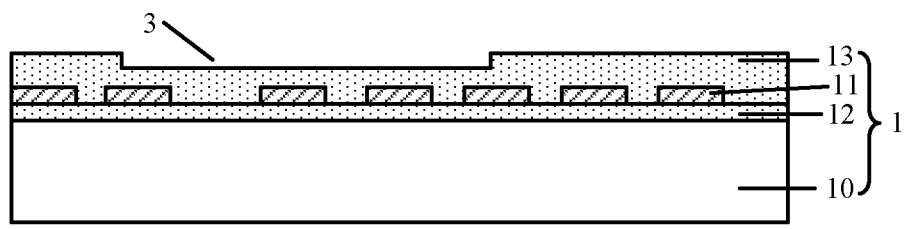
FIG. 2 is a schematic sectional structural diagram of a first substrate according to an embodiment of the present disclosure.

Referring to FIG. 2, a first substrate 1 is prepared. The first substrate 1 includes a first base 10, at least one conductive layer 11, and a signal processing circuit and/or a driving circuit (not shown in FIG. 2) which are arranged on a side of the first base 10. The signal processing circuit and/or the driving circuit is electrically connected to the conductive layer 11.

In the embodiment, a first dielectric layer 12 is provided on a surface of the first base 10, and the at least one conductive layer 11 is arranged on a surface of the first dielectric layer 12. The signal processing circuit and/or the driving circuit have a semiconductor device structure and an electrical interconnection structure (such as copper interconnection). The conductive layer 11 may be a part of a conductive layer of the signal processing circuit and/or the driving circuit, and may also be a conductive layer added to the signal processing circuit and/or the driving circuit, as long as the conductive layer 11 is electrically connected to the signal processing circuit and/or the driving circuit.

In the embodiment, the first base 10 includes a silicon substrate, a silicon-germanium substrate, a silicon carbide substrate or an III-V compound substrate (such as a gallium nitride substrate or a gallium arsenide substrate).

A material of the first dielectric layer 12 includes silicon oxide, silicon nitride, silicon oxynitride, a low-k dielectric material (a material with a dielectric constant of 2.5 to 3.9) or an ultra-low-k dielectric material (a material with a dielectric constant smaller than 2.5). The first dielectric layer 12 may be formed through an oxidation process, a chemical vapor deposition process, physical vapor deposition process, an atomic layer deposition process or the like.

A material of the conductive layer 11 includes metal, a metallic compound or an ion-doped semiconductor material. The conductive layer 11 is formed by: depositing a conductive material layer on the surface of the first dielectric layer 12; forming a patterned layer on a surface of the conductive material layer, where a partial region of the conductive material layer is exposed through the patterned layer; and etching the conductive material layer using the patterned layer as a mask, to form the conductive layer 11. The conductive material layer may be formed by a chemical vapor deposition process, a physical vapor deposition process, an atomic layer deposition process, or the like. The patterned layer is a photoresist layer processed by photolithography. The conductive material layer may be etched by dry etching process.

Figure 3:
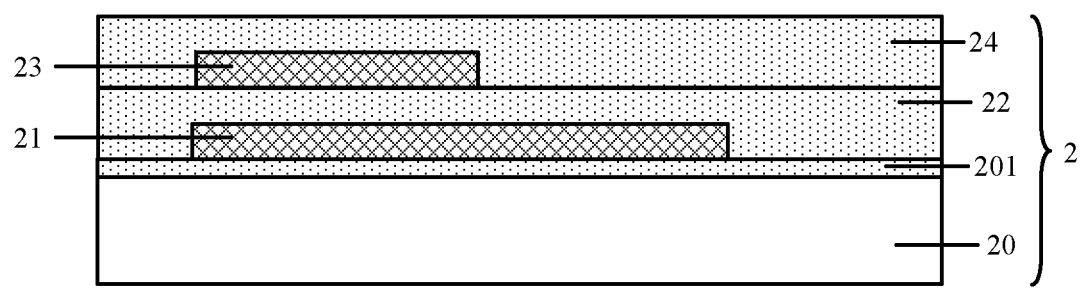
FIG. 3 is a schematic sectional structural diagram of a second substrate according to an embodiment of the present disclosure.

Referring to FIG. 3, a second substrate 2 is prepared. The second substrate 2 includes a second base 20, a first electrode 21 arranged on a side of the second base 20 and a piezoelectric layer 22 arranged on the first electrode 21. Specifically, a second dielectric layer 201 is provided on a surface of the second base 20, and the first electrode 21 is arranged on a surface of the second dielectric layer 201. A second electrode is provided on a surface of the piezoelectric layer 22 or in the conductive layer 11. In the embodiment, a case where the second electrode 23 is provided on the surface of the piezoelectric layer 22 is taken as an example for illustration.

In the embodiment, only a case where the MEMS piezoelectric transducer includes one piezoelectric capacitor formed by the first electrode 21, the piezoelectric layer 22 and the second electrode 23 is taken as an example for illustration. However, the present disclosure is not limited thereto, and the MEMS piezoelectric transducer may include multiple piezoelectric capacitors described above in other embodiment.

In an embodiment, the second base 20, the second dielectric layer 201 and the first electrode 21 are formed by a silicon-on-insulator semiconductor substrate.

Figure 4A:
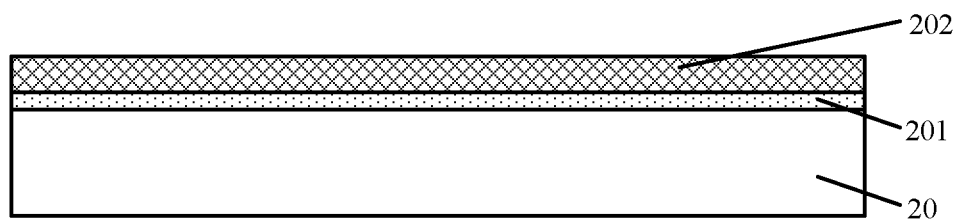
FIG. 4A to 4D are schematic sectional structural diagrams of a second substrate in a forming process according to an embodiment of the present disclosure.

Referring to FIG. 4A, a silicon-on-insulator (SOI), that is, a silicon-on-insulator semiconductor substrate, is prepared. The silicon-on-insulator semiconductor substrate includes a base, an insulating layer arranged on a surface of the base and a semiconductor layer arranged on a surface of the insulating layer. The base is the second base 20, and the insulating layer is the second dielectric layer 201. The semiconductor layer 202 may be a first electrode layer or a part of the first electrode layer. Alternatively, an insulating layer is formed on the semiconductor layer 202, and the first electrode layer is deposited on the insulating layer.

Figure 4B:
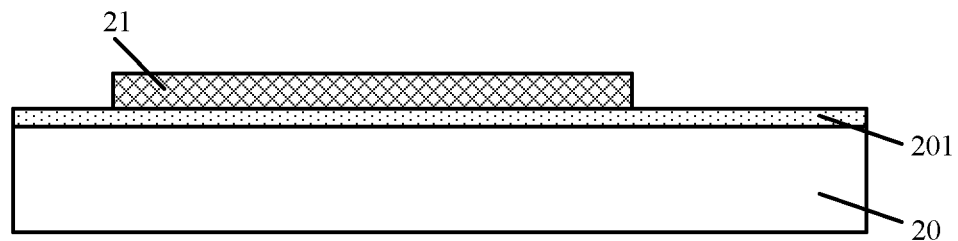

Referring to FIG. 4B, the semiconductor layer 202 is etched to form the first electrode 21. Alternatively, in another embodiment, a conductive layer may be deposited on the semiconductor layer 202, and the conductive layer is etched to form the first electrode 21.

Figure 4C:
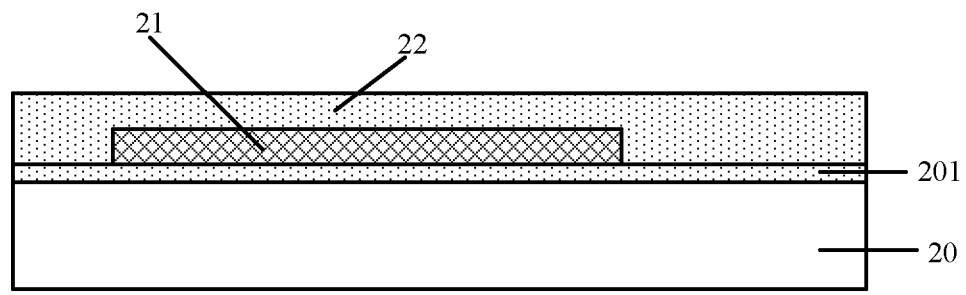

Referring to FIG. 4C, a piezoelectric layer 22 is formed on the first electrode 21.

Figure 4D:
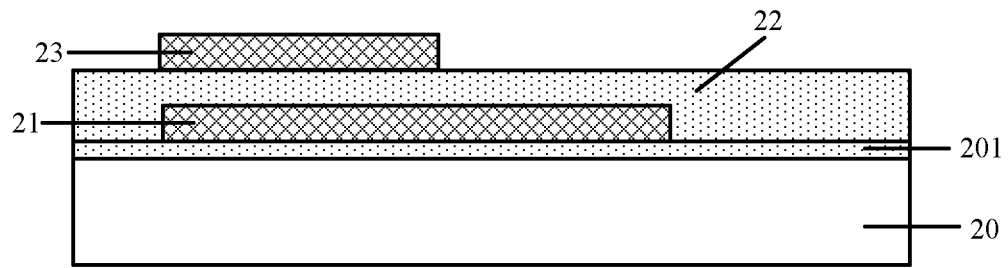

Referring to FIG. 4D, a second electrode layer is formed on the surface of the piezoelectric layer 22, and the second electrode layer is etched to form the second electrode 23, so as to form the piezoelectric capacitor including the first electrode 21, the piezoelectric layer 22 and the second electrode 23.

The silicon-on-insulator semiconductor substrate includes a silicon-on-insulator substrate. A material of the second dielectric layer 201 includes silicon oxide, that is, a buried oxide layer (BOX). Since the material of the semiconductor layer includes a mono-crystalline semiconductor material, the formed piezoelectric transducer has stable and reliable performance. In addition, the piezoelectric layer 22 with good performance may be grown with an epitaxial method in a case that the semiconductor layer of the silicon-on-insulator semiconductor substrate serves as the first electrode layer, thereby manufacturing a transducer with high performance.

In addition, the semiconductor layer 202 may be a mono-crystalline semiconductor or a poly-crystalline semiconductor. In a case of using the SOI substrate, a process of thinning the second substrate 2 after attaching and fixing the first substrate 1 to the second substrate 2 can be simple, and thus the process flow can be simplified. Also, the semiconductor layer 202 may further serve as a mechanical support film for the piezoelectric capacitor, thereby providing a good and stable mechanical structure for the transducer.

In another embodiment, the second base 20 is a bulk wafer substrate. The bulk wafer substrate includes a silicon wafer substrate, a silicon-germanium wafer substrate, a silicon carbide wafer substrate or other substrate. The first electrode layer, the piezoelectric layer 22 and the second electrode layer are formed through a deposition process. The second dielectric layer 201 is made of an insulating material. The first electrode layer and the second electrode layer may be made of metal or a metallic compound, and may also be made of a semiconductor material. The first electrode layer and the second electrode layer may be made of the same material or different materials.

In the embodiment, the method further includes: forming a first bonding layer 13 on a surface of the side of the first substrate 1 where the conductive layer 11 is arranged, and/or forming a second bonding layer 24 on a surface of a side of the second substrate 2 where the first electrode 21 and the piezoelectric layer 22 are arranged. The first substrate 1 and the second substrate 2 are attached and fixed together through the first bonding layer 13 and/or the second bonding layer 24.

In the embodiment, a case where the first bonding layer 13 is arranged on the surface of the first substrate 1 and the second bonding layer 24 is arranged on the surface of the second substrate 2 is taken as an example for illustration. However, the present disclosure is not limited thereto. In another embodiment, the second bonding layer 13 may not be arranged on the second substrate 2 in a case that the first bonding layer 13 is provided on the surface of the first substrate 1. Alternatively, the first bonding layer 13 may not be arranged on the first substrate 1 in a case that the second bonding layer 24 is provided on the surface of the second substrate 2.

Referring to FIG. 2, the first bonding layer 13 is provided on the surface of the side of the first substrate 1 where the conductive layer 11 is arranged. The first bonding layer 13 is formed by depositing a first bonding film on surfaces of the first dielectric layer 12 and the conductive layer 11, and planarizing the first bonding film using a chemical mechanical polishing process, to form the first bonding layer.

Referring to FIG. 3, the second bonding layer 24 is provided on the surface of the side of the second substrate 2 where the first electrode 21 and the piezoelectric layer 22 are arranged. Similarly, the second bonding layer 24 is formed by depositing a second bonding film on a surface of the second electrode 23, and planarizing the second bonding film using a chemical mechanical polishing process, to form the second bonding layer 24.

The first bonding layer 13 and the second bonding layer 24 are made of one or a combination of an insulating material, a metal material, a metallic compound material and a semiconductor material. In an embodiment, at least one of the first bonding layer 13 and the second bonding layer 24 includes an insulating structure. In the embodiment, the first bonding layer 13 and/or the second bonding layer 24 includes an insulating structure. The insulation structure may have an area corresponding to the entire first substrate or a part of the first substrate. If the insulation structure has an area corresponding to a part of the first substrate, the part of the layer corresponding to the other part of the first substrate may be conductive.

Since the surfaces of the first bonding layer 13 and the second bonding layer 24 are planarized, the first substrate 1 and the second substrate 2 have a large contact surface area after the first substrate 1 and the second substrate 2 are attached and fixed together through the first bonding layer 13 and the second bonding layer 24. Therefore, the stacked structure of the first substrate 1 and the second substrate 2 has great strength and stable bonding.

In the embodiment, before the side of the first substrate 1 where the conductive layer 11 is arranged are attached and fixed to the side of the second substrate 2 where the first electrode 21 and the piezoelectric layer 22 are arranged, the method further includes: forming a first opening 3 on the side of the first substrate 1 where the conductive layer 11 is arranged and/or the side of the second substrate 2 where the first electrode 21 and the piezoelectric layer 22 are arranged, such that the first opening 3 forms a cavity 30 between the first substrate 1 and second substrate 2 after they are attached and fixed together.

Referring to FIG. 2 and FIG. 3, in the embodiment, the first opening 3 is provided on the side of the first substrate 1 where the conductive layer 11 is arranged and the first opening is not provided on the side of the second substrate 2 where the first electrode 21 and the piezoelectric layer 22 are arranged. This case is only taken as an example for illustration, and the present disclosure is not limited thereto. In another embodiment, the first opening may not be provided on the side of the first substrate 1 where the conductive layer 11 is arranged, and the first opening may be provided on the side of the second substrate 2 where the first electrode 21 and the piezoelectric layer 22 are arranged. Alternatively, the first openings are provided on both the side of the first substrate 1 where the conductive layer 11 is arranged and the side of the second substrate 2 where the first electrode 21 and the piezoelectric layer 22 are arranged.

Figure 5:
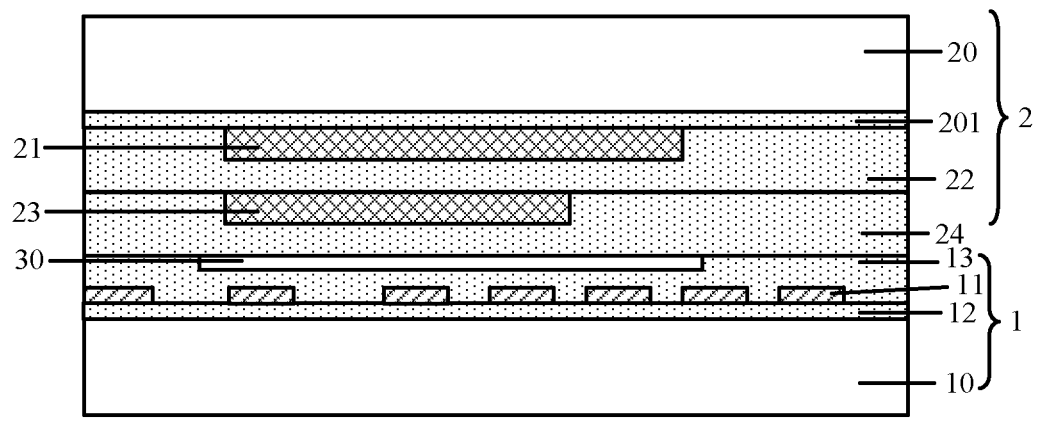
FIG. 5 is a schematic sectional structural diagram of a first substrate and a second substrate which are attached and fixed together according to an embodiment of the present disclosure.

Referring to FIG. 5, the first substrate 1 shown in FIG. 2 and the second substrate 2 shown in FIG. 3 are attached and fixed together. Specifically, the side of the first substrate 1 where the conductive layer 11 is arranged and the side of the second substrate 2 where the first electrode 21 and the piezoelectric layer 22 are arranged are attached and fixed, and the cavity 30 corresponding to the first electrode 21 is provided between the first substrate 1 and the second substrate 2. The cavity 30 is formed by the first opening 3. The cavity 30 facilitates the deformation of the first electrode 21 and the piezoelectric layer 22 under external pressure.

In an embodiment, the first substrate 1 and the second substrate 2 are attached and fixed by a bonding process. The bonding process may include fusion bonding, anodic bonding, eutectic bonding, thermal compression bonding or the like. In another embodiment, the first substrate 1 and the second substrate 2 is attached and fixed through an adhesive bonding process. That is, the first substrate 1 and the second substrate 2 are attached and fixed through the first adhesive bonding layer 13 and/or the second adhesive bonding layer 24.

Figure 6A:
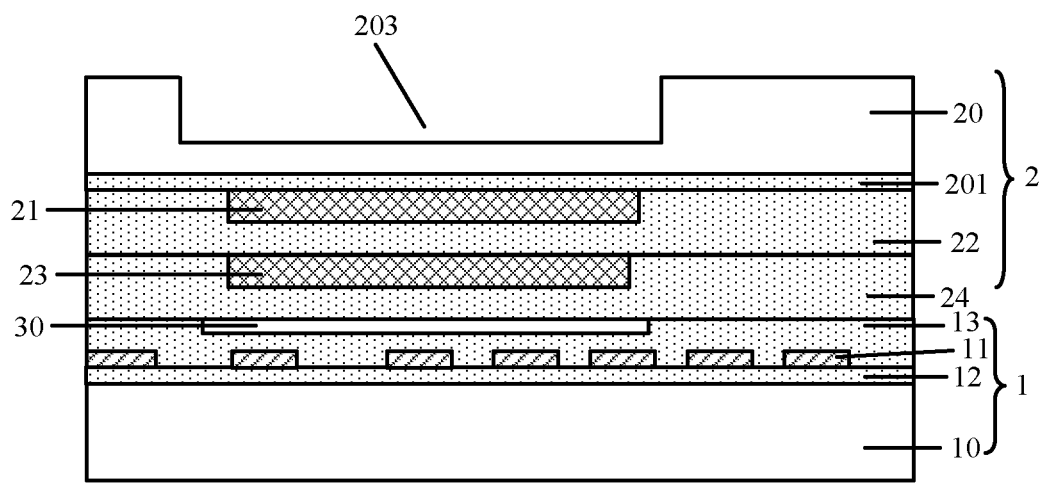
FIG. 6A to FIG. 8 are schematic sectional structural diagrams of a first substrate and a second substrate which are attached and fixed together in a forming process according to an embodiment of the present disclosure.
Figure 6B:
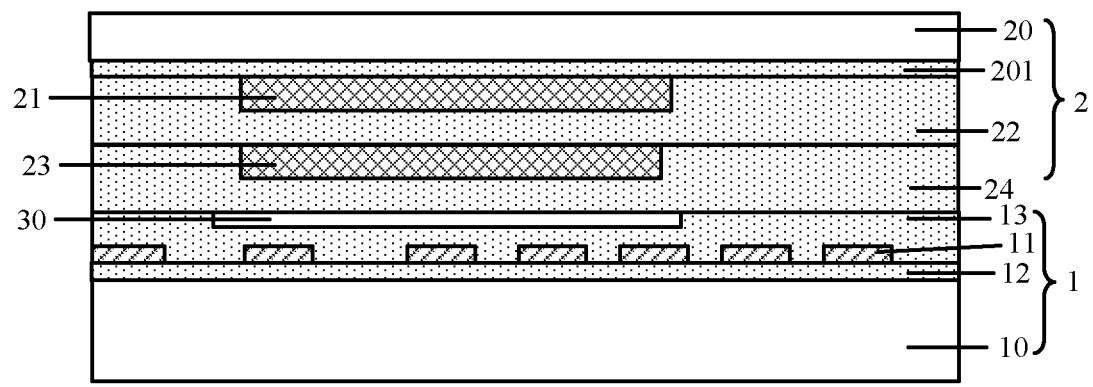

Referring to FIG. 6A, a side of the second substrate 2 facing away from the first substrate 1 is thinned by removing entirely or a part of the second base 20 in a thickness direction, so as to form a deformable mechanical film. In the embodiment, an opening 203 is formed on the side of the second substrate 2 facing away from the first substrate 1. However, the present disclosure is not limited thereto. In another embodiment, referring to FIG. 6B, the side of the second substrate 2 facing away from the first substrate 1 may be thinned uniformly. In addition, it should be noted that the opening 203 in the embodiment is formed before forming a conductive through via. However, the present disclosure is not limited thereto. In another embodiment, the opening 203 may be formed after forming the conductive through via.

The second base 20 is thinned by the chemical mechanical polishing process and/or an etching process. The etching process includes a dry etching process and/or a wet etching process. Since the first dielectric layer 201 is provided between the second base 20 and the first electrode 21, the first dielectric layer 201 can protect and isolate the first electrode 21 after the entire or a part of the second base 20 is removed in a thickness direction. The first electrode 21 and the piezoelectric layer 22 are deformed when the first dielectric layer 201 and the reserved second base 20 are subjected to pressure.

Figure 7A:
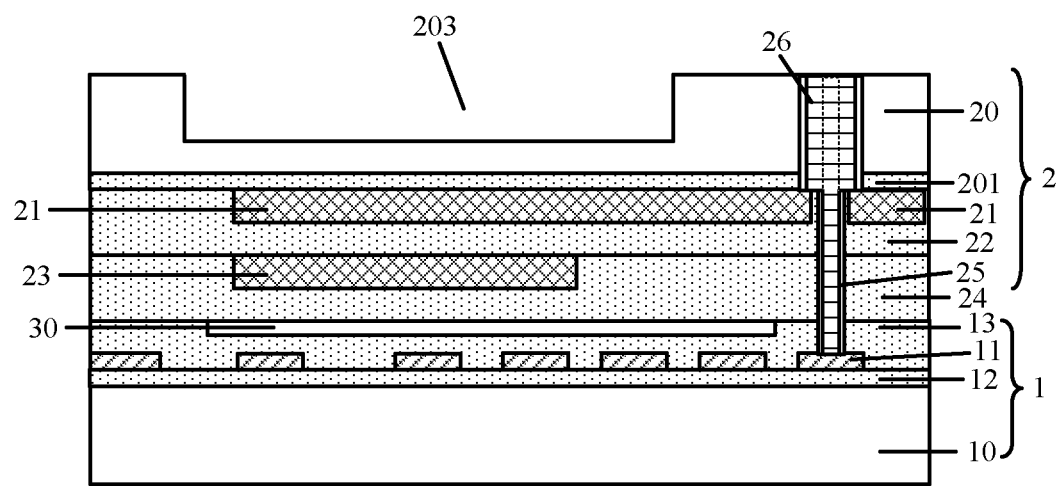
Figure 7B:
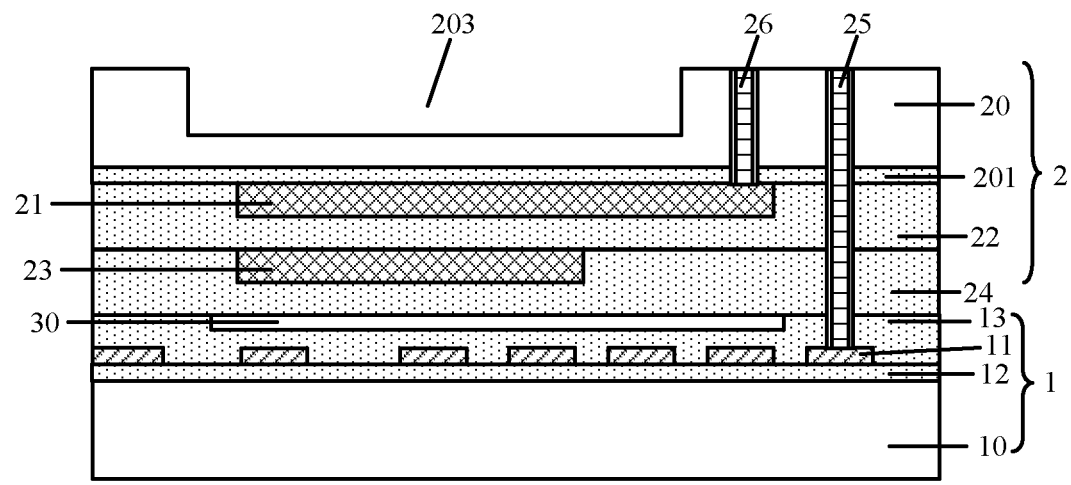
Figure 8:
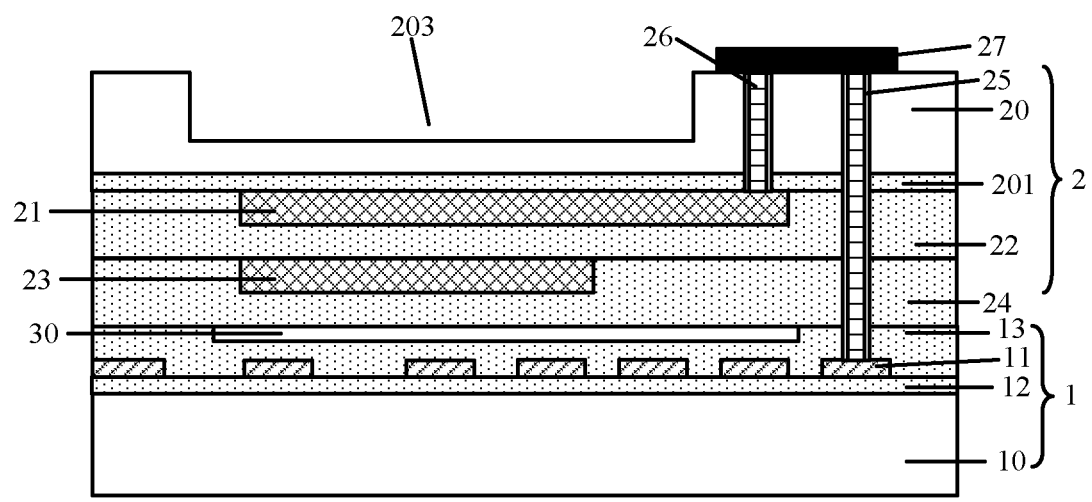

Referring to FIG. 7A, FIG. 7B and FIG. 8, the conductive through via for electrically connecting the first electrode 21 with the conductive layer 11 is formed after attaching and fixing the first substrate 1 to the second substrate 2, so as to electrically connect the first electrode 21, the piezoelectric layer 22 and the second electrode 23 with the signal processing circuit and/or the driving circuit.

The conductive through via for electrically connecting the first electrode 21 with the conductive layer 11 is formed as follows.

Referring to FIG. 7A or FIG. 7B, a first conductive through via 25 extending from a side of the second base 20 facing away from the first substrate 1 to the conductive layer 11 is formed, and a second conductive through via 26 extending from the side of the second base 20 facing away from the first substrate 1 to the first electrode 21 is also formed. As shown in FIG. 7A, the second conductive through via 26 is a part of the first conductive through via 25, that is, the first conductive through via 25 and the second conductive through via 26 are electrically connected directly. Therefore the first electrode 21, the piezoelectric layer 22 and the second electrode 23 are electrically connected to the conductive layer 11 via the first conductive through via 25 and second conductive through via 26 which are electrically connected to each other. In another embodiment, as shown in FIG. 7B, the first conductive through via 25 and the second conductive through via 26 are not electrically connected directly. In such case, referring to FIG. 8, a conductive connection layer/structure 27 for electrically connecting the first conductive through via 25 with the second conductive through via 26 is formed on a surface of the side of the second base 20 facing away from the first substrate 1. In this way, the first electrode 21, the piezoelectric layer 22, and the second electrode 23 are electrically connected to the conductive layer 11 via the first conductive through via 25, the second conductive through via 26 and the conductive connection layer/structure 27 which are electrically connected to each other.

The first electrode 21, the piezoelectric layer 22 and the second electrode 23 are electrically connected to the conductive layer 11, and therefore electrically connected to the signal processing circuit and/or the driving circuit, so that the signal processing circuit receives an electrical signal outputted when the piezoelectric capacitor consisting of the first electrode 21, the piezoelectric layer 22 and the second electrode 23 is deformed, or the driving circuit outputs an electrical signal to the piezoelectric capacitor to cause it to deform.

In another embodiment, the second electrode 23 on the surface of the piezoelectric layer 22 may be electrically connected to the conductive layer 11 via a conductive through via. Similarly, the conductive through via includes a third conductive through via extending from the side of the second base 20 facing away from the first substrate 1 to the conductive layer 11 and a fourth conductive through via extending from the side of the second base 20 facing away from the first substrate 1 to the second electrode 23. The third conductive through via and the fourth conductive through via are electrically connected directly, or electrically connected through a conductive connection layer arranged on a surface of the side of the second base 20 facing away from the first substrate 1.

Based on this, in a case that the transducer is a pressure-sensing device, the piezoelectric capacitor formed by the first electrode 21, the piezoelectric layer 22 and the second electrode 23 is deformed under external pressure, thereby generating a potential difference between the first electrode 21 and the second electrode 23. The signal processing circuit can acquire information such as pressure applied on the piezoelectric transducer based on a change in the potential difference outputted by the piezoelectric capacitor formed by the first electrode 21, the second electrode 23 and the piezoelectric layer 22 therebetween. In a case that the transducer is applied to an actuator device, the driving circuit may output an electrical signal to the piezoelectric capacitor formed by the first electrode 21, the second electrode 23 and the piezoelectric layer 22 therebetween, so as to drive the first electrode 21, the second electrode 23 and the piezoelectric layer 22 therebetween to be deformed, thereby delivering information such as pressure or sound to the outside.

Figure 9:
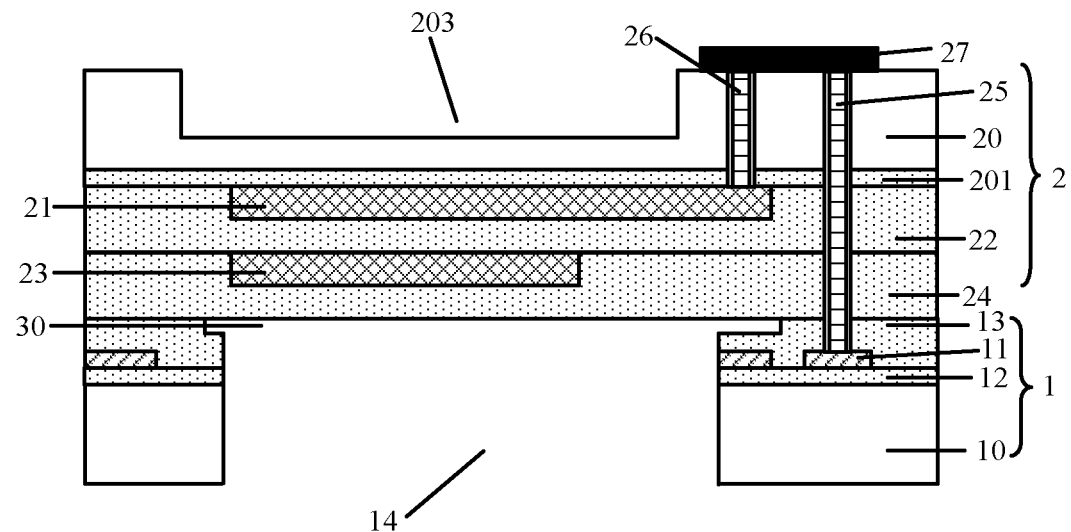
FIG. 9 is a schematic sectional structural diagram of an MEMS piezoelectric transducer including a second opening according to an embodiment of the present disclosure.

In another embodiment of the present disclosure, referring to FIG. 9, a second opening 14 is formed on a side of the first substrate 1 facing away from the second substrate 2, and a position of the second opening 14 corresponds to a position of the first electrode 21. The formation of the second opening 14 facilitates communication between the outside (underside) environment and the piezoelectric capacitor, and also facilitates deformation of the piezoelectric capacitor.

The second opening 14 is formed by forming a patterned layer on a surface of the first substrate 1 facing away from the second substrate 2, where a position at which the second opening 14 is to be formed is exposed through the patterned layer; and etching the first substrate 1 using the patterned layer as a mask until the first substrate 1 is etched through, to form the second opening 14. The patterned layer includes a patterned photoresist layer, and the etching process includes an anisotropic dry etching process.

In another embodiment of the present disclosure, the second opening 14 may also be formed before attaching and fixing the first substrate and the second substrate together. The second opening 14 is formed by forming a patterned layer on a surface of the first substrate 1 facing the second substrate 2, where a position at which the second opening 14 is to be formed is exposed through the patterned layer; and etching the first substrate 1 using the patterned layer as the mask until the first substrate 1 is etched through, to form the second opening 14.

Figure 10A:
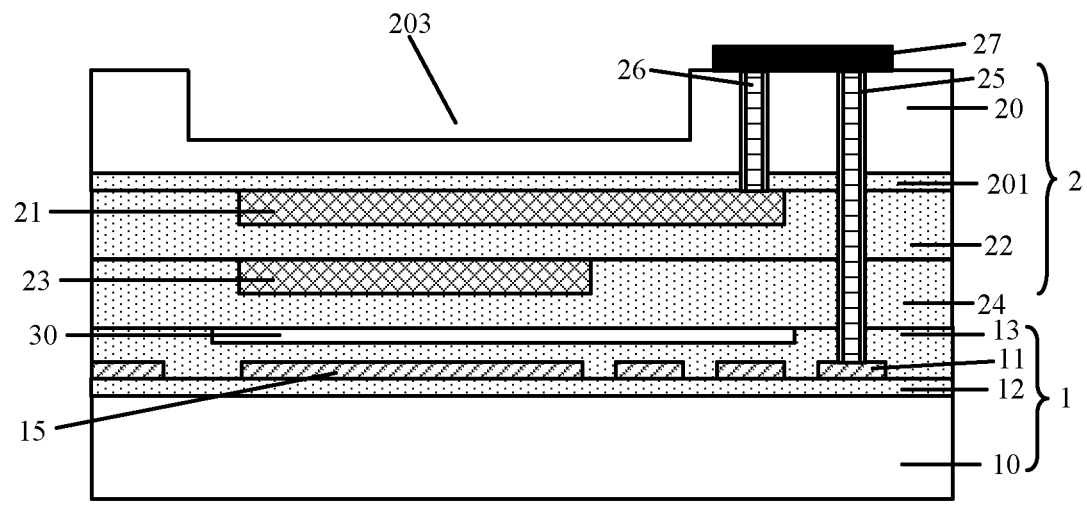
FIG. 10A is a schematic sectional structural diagram of an MEMS piezoelectric transducer including a third electrode according to an embodiment of the present disclosure.

In another embodiment of the present disclosure, referring to FIG. 10A, a third electrode 15 is arranged on the side of the first substrate 1 where the conductive layer 11 is arranged. A position of the third electrode 15 corresponds to the position of the first electrode 21, and the third electrode 15 is a self-test electrode. In the embodiment, the third electrode 15 is arranged in a same layer as the conductive layer 11. In another embodiment, the third electrode 15 may be arranged in a higher or lower layer than the conductive layer 11. In a case that a voltage is applied on the third electrode 15, the third electrode 15 generates an electrostatic pull on an electrode of the piezoelectric capacitor in the second substrate 2, and the first electrode 21 and the piezoelectric layer 22 are deformed under the electrostatic pull. Whether the piezoelectric capacitor can operate normally is detected by measuring whether an output of the piezoelectric capacitor is changed under the electrostatic pull.

Figure 10B:
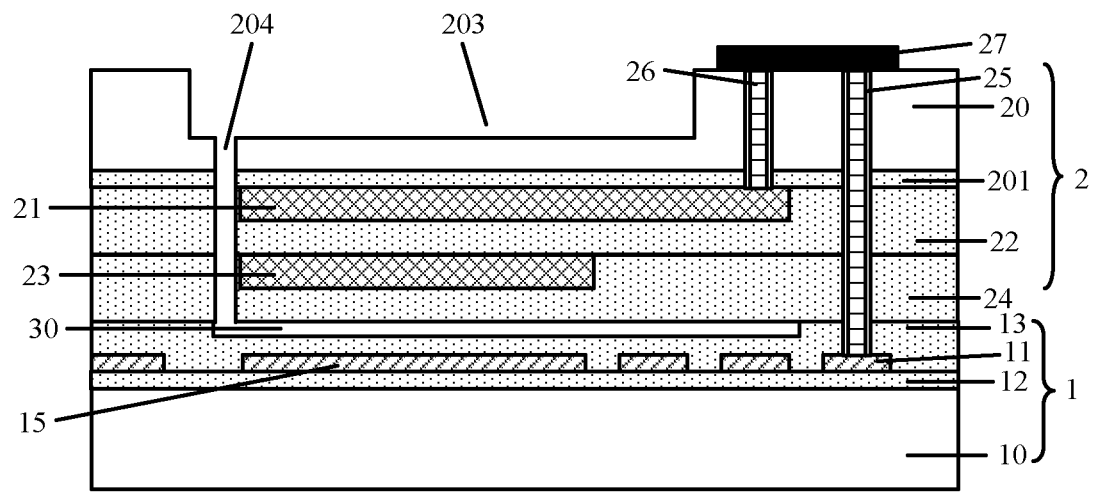
FIG. 10B is a schematic sectional structural diagram of am MEMS piezoelectric transducer including a third opening according to an embodiment of the present disclosure.

In another embodiment of the present disclosure, referring to FIG. 10B, a third opening 204 is formed on the side of the second substrate 2 facing away from the first substrate 1. The third opening 204 extends from the side of the second substrate 2 facing away from the first substrate 1 to the cavity 30, to mechanically partial-release the piezoelectric capacitor structure including the first electrode 21, the piezoelectric layer 22 and the second electrode 23.

Correspondingly, an MEMS piezoelectric transducer is further provided according to an embodiment of the present disclosure, and the MEMS piezoelectric transducer may be manufactured using the method for manufacturing the MEMS piezoelectric transducer according to the embodiments described above. Referring to FIG. 8, the MEMS piezoelectric transducer includes a first substrate 1 and a second substrate 2 which are attached and fixed together.

The first substrate 1 includes a first base 10, at least one conductive layer 11, and a signal processing circuit and/or a driving circuit arranged on a side of the first base 10. The signal processing circuit and/or the driving circuit is electrically connected to the conductive layer 11.

The second substrate 2 includes a second base 20, a first electrode 21 arranged on a side of the second base 20 and a piezoelectric layer 22 arranged on the first electrode 21.

A side of the first substrate 1 where the conductive layer 11 is arranged is attached and fixed to a side of the second substrate 2 where the first electrode 21 and the piezoelectric layer 22 are arranged. A cavity 30 corresponding to the first electrode 21 is provided between the first substrate 1 and the second substrate 2. The second base 20 in a region of the second substrate 2 corresponding to the first electrode 21 has a zero, or partial or full thickness. The first electrode 21 is electrically connected to the conductive layer 11 through a conductive through via, so as to electrically connect the first electrode 21 to the signal processing circuit and/or the driving circuit. A second electrode 23 is provided on a surface of the piezoelectric layer 22 or in the conductive layer 11, and the second electrode 23 corresponds to the first electrode 21. In the embodiment, only a case where the second electrode 23 is arranged on the surface of the piezoelectric layer 22 is taken as an example for illustration. However, the present disclosure is not limited thereto.

In the embodiment, the conductive through via includes a first conductive through via 25 and a second conductive through via 26. The first conductive through via 25 extends from a side of the second base 20 facing away from the first substrate 1 to the conductive layer 11, and the second conductive through via 26 extends from the side of the second base 20 facing away from the first substrate 1 to the first electrode 21. As shown in FIG. 7A, the first conductive through via 25 and the second conductive through via 26 are electrically connected directly. The first electrode 21, the piezoelectric layer 22 and the second electrode 23 are electrically connected to the conductive layer 11 via the first conductive through via 25 and second conductive through via 26 which are electrically connected to each other. Alternatively, as shown in FIG. 8, the first electrode 21, the piezoelectric layer 22 and the second electrode 23 are electrically connected to the conductive layer 11 via the first conductive through via 25, the second conductive through via 26 and the conductive connection layer/structure 27 which are electrically connected to each other.

In the embodiment, the first substrate 1 further includes a first bonding layer 13 arranged on a surface of a side of the first base 10 where the conductive layer 11 is arranged, and/or the second substrate 2 further includes a second bonding layer 24 arranged on a surface of a side of the second base 20 where the first electrode 21 and the piezoelectric layer 22 are arranged. The first substrate 1 and the second substrate 2 are attached and fixed together through the first bonding layer 13 and/or the second bonding layer 24. In an embodiment, at least one of the first bonding layer 13 and the second bonding layer 24 includes an insulating structure. In the embodiment, the first bonding layer 13 and/or the second bonding layer 24 includes an insulating structure. The insulation structure may have an area corresponding to the entire first substrate or a part of the first substrate. If the insulation structure has an area corresponding to a part of the first substrate, the part of the layer corresponding to the other part of the first substrate may be conductive.

In another embodiment of the present disclosure, referring to FIG. 8, a first opening is provided on the side of the first substrate 1 where the conductive layer 11 is arranged and/or the side of the second substrate 2 where the first electrode 21 and the piezoelectric layer 22 are arranged. The first opening between the first substrate 1 and the second substrate 2 forms a cavity 30.

In another embodiment of the present disclosure, referring to FIG. 9, a second opening 14 is provided on a side of the first substrate 1 facing away from the second substrate 2. A position of the second opening 14 corresponds to a position of the first electrode 21.

In another embodiment of the present disclosure, referring to FIG. 10A, a third electrode 15 is provided on the side of the first substrate 1 where the conductive layer 11 is arranged. The third electrode 15 is a self-test electrode, and a position of the third electrode 15 corresponds to the position of the first electrode 21.

In another embodiment of the present disclosure, referring to FIG. 10B, a third opening 204 is provided on the side of the second substrate 2 facing away from the first substrate 1. The third opening 204 extends from the side of the second substrate 2 facing away from the first substrate 1 to the cavity 30.

In the MEMS piezoelectric transducer and the method for manufacturing the MEMS piezoelectric transducer according to the embodiments of the present disclosure, the first substrate includes the first base, at least one conductive layer, and the signal processing circuit and/or the driving circuit arranged on a side of the first base. The signal processing circuit and/or the driving circuit is electrically connected to the conductive layer. The second substrate includes the second base, the first electrode arranged on a side of the second base, and the piezoelectric layer arranged on the first electrode. The side of the first substrate where the conductive layer is arranged is attached and fixed to the side of the second substrate where the first electrode and the piezoelectric layer are arranged, and the cavity corresponding to the first electrode is formed between the first substrate and the second substrate. The first electrode and the conductive layer are electrically connected to each other through the conductive through via, such that the signal processing circuit may receive an electrical signal outputted by the deformed first electrode and the piezoelectric layer, and the driving circuit may output an electrical signal to the first electrode to deform the first electrode and the piezoelectric layer.

Based on this, a stacked structure of the first substrate and the second substrate is formed by attaching and fixing the side of the first substrate where the conductive layer is arranged to the side of the second substrate where the first electrode and the piezoelectric layer are arranged, thereby not only solving a problem of poor performance of the MEMS piezoelectric transducer resulting from the constraints of forming the first electrode, the piezoelectric layer and the signal processing circuit and/or the driving circuit sequentially on a same base, but also easily forming the cavity between the first substrate and the second substrate to provide space for deformation of the first electrode and the piezoelectric layer, which reduces process difficulty. Therefore, materials and manufacturing processes of the second base, the first electrode and the piezoelectric layer can be selected freely, and the formed piezoelectric transducer has a high sensitivity and performance.

Figure 11:
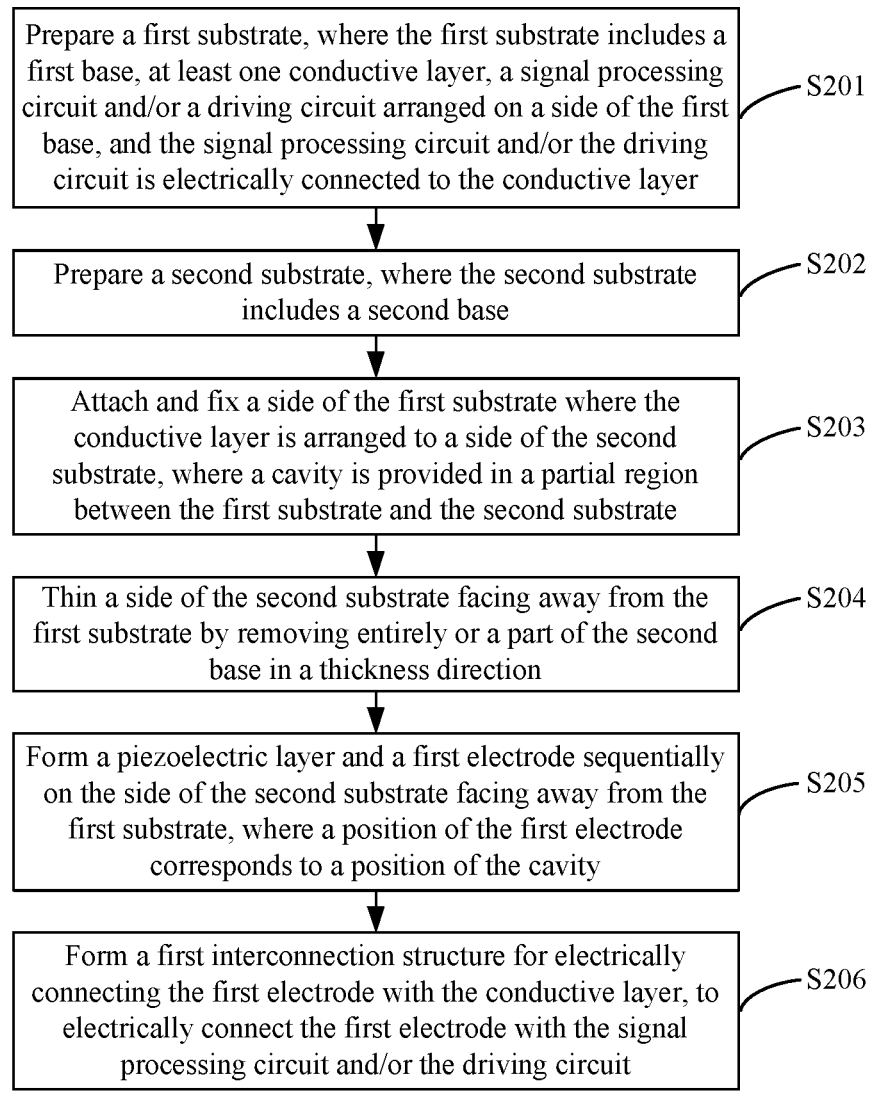
FIG. 11 is a flowchart of a method for manufacturing an MEMS piezoelectric transducer according to another embodiment of the present disclosure.

A method for manufacturing an MEMS piezoelectric transducer is further provided according to an embodiment of the present disclosure. As shown in FIG. 11, the method includes steps S201 to S206.

In step S201, a first substrate is prepared. The first substrate includes a first base, at least one conductive layer and a signal processing circuit and/or a driving circuit arranged on a side of the first base. The signal processing circuit and/or the driving circuit is electrically connected to the conductive layer.

In step S202, a second substrate is prepared, where the second substrate includes a second base.

In step S203, a side of the first substrate where the conductive layer is arranged is attached and fixed to a side of the second substrate. A cavity is provided in a region between the first substrate and the second substrate.

In the step S204, a side of the second substrate facing away from the first substrate is thinned by removing entirely or a part of the second base in a thickness direction.

In the step S205, a piezoelectric capacitor is formed on the side of the second substrate facing away from the first substrate. The piezoelectric capacitor includes a first electrode, a piezoelectric layer and a second electrode, and a position of the piezoelectric capacitor corresponds to a position of a cavity.

In the step S206, a conductive through via for electrically connecting the first electrode with the conductive layer is formed, so as to electrically connect the first electrode to the signal processing circuit and/or the driving circuit.

The piezoelectric capacitor is electrically connected to the conductive layer through the conductive through via, and the conductive layer is electrically connected to the signal processing circuit and/or the driving circuit. Therefore, the first electrode is electrically connected to the signal processing circuit and/or the driving circuit. Based on this, the signal processing circuit may receive an electrical signal outputted by an electrode of the deformed piezoelectric capacitor, and/or the driving circuit may output an electrical signal to the electrode of the piezoelectric capacitor to deform the piezoelectric capacitor, so as to deliver information such as pressure or sound to the outside.

In the embodiment, a stacked structure of the first substrate and the second substrate is formed by attaching and fixing the side of the first substrate where the conductive layer is arranged to the second substrate, and a cavity corresponding to the first electrode is formed between the first substrate and the second substrate. The cavity is formed easily, which provides space for deformation of the first electrode and the piezoelectric layer. Also, in the embodiment, a new base material may be provided for forming the piezoelectric capacitor (including the first electrode, the piezoelectric layer, the second electric and the like), thereby solving the problem of poor performance of the MEMS piezoelectric transducer resulting from the constraints of the signal processing circuit and/or driving circuit, and reducing process difficulty. Therefore, materials and manufacturing processes of the second base, the first electrode and the piezoelectric layer can be selected freely, and the formed piezoelectric transducer has good performance.

A process of manufacturing the MEMS piezoelectric transducer is described hereinafter in conjunction with sectional structures shown in FIG. 12 to FIG. 19.

Figure 12:
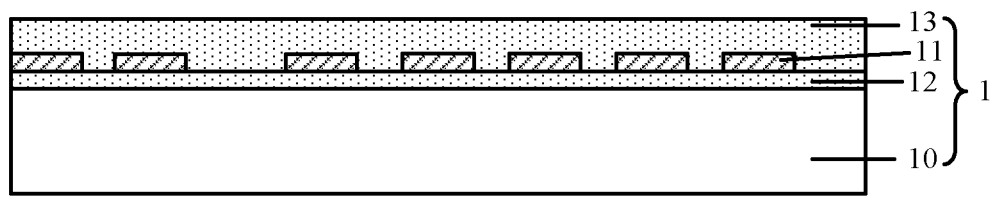
FIG. 12 to FIG. 17 are schematic sectional structural diagrams of an MEMS piezoelectric transducer in a forming process according to another embodiment of the present disclosure.

Referring to FIG. 12, a first substrate 1 is prepared. The first substrate 1 includes a first base 10, at least one conductive layer 11 and a signal processing circuit and/or a driving circuit (not shown in FIG. 12) arranged on a side of the first base 10. The signal processing circuit and/or the driving circuit is electrically connected to the conductive layer 11.

In the embodiment, a first dielectric layer 12 is provided on a surface of the first base 10, and at least one conductive layer 11 is arranged on a surface of the first dielectric layer 12. The signal processing circuit and/or the driving circuit includes a semiconductor device structure and an electrical interconnection structure (such as copper interconnection). The conductive layer 11 may be a part of a conductive layer of the signal processing circuit and/or the driving circuit, or may also be a conductive layer added to the signal processing circuit and/or the driving circuit, as long as the conductive layer 11 is electrically connected to the signal processing circuit and/or the driving circuit.

The conductive layer 11 is made of metal, a metallic compound or an ion-doped semiconductor material. The conductive layer 11 is formed by depositing a conductive material layer on the surface of the first dielectric layer 12; forming a patterned layer on a surface of the conductive material layer, where a partial region of the conductive material layer is exposed through the patterned layer; and etching the conductive material layer using the patterned layer as a mask, to form the conductive layer 11. The conductive material layer may be formed by a chemical vapor deposition process, a physical vapor deposition process, an atomic layer deposition process or the like. The patterned layer includes a photoresist layer processed by photolithography. The conductive material layer may be etched by a dry etching process.

Figure 13:
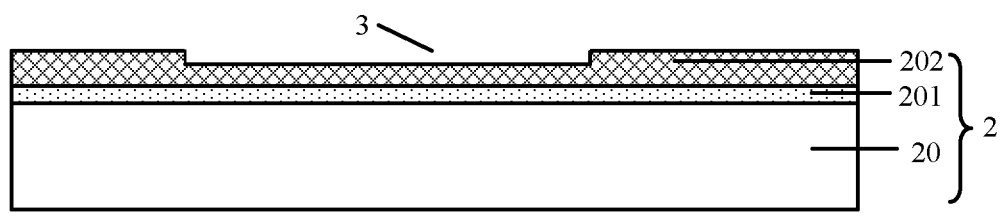

Referring to FIG. 13, a second substrate 2 is prepared. The second substrate 2 includes a second base 20.

In the embodiment, the second substrate is a semiconductor-on-insulator (SOI) substrate. The silicon-on-insulator semiconductor substrate includes a base, an insulating layer 201 arranged on a surface of the base and a semiconductor layer 202 arranged on a surface of the insulating layer 201. The semiconductor layer 202 may be a mono-crystalline semiconductor or a poly-crystalline semiconductor, and the base is the second base 20. Apparently, the present disclosure is not limited thereto. In another embodiment, the second base 20 is a bulk wafer substrate base. The bulk wafer substrate base includes a silicon wafer substrate, a silicon-germanium wafer substrate, a silicon carbide wafer substrate or the like.

Figure 14:
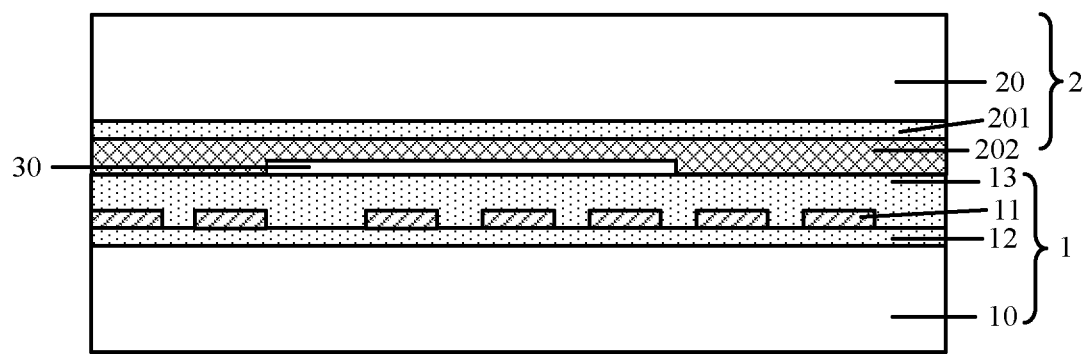

Referring to FIG. 14, a side of the first substrate 1 where the conductive layer 11 is arranged is attached and fixed to a side of the second base 20, and a cavity 30 is formed in a region between the first substrate 1 and the second substrate 2. The cavity 30 facilitates deformation of a first electrode 21 and a piezoelectric layer 22 under external pressure. In the embodiment, the second substrate 2 is the silicon-on-insulator semiconductor substrate, and the side of the first substrate where the conductive layer 11 is arranged is attached and fixed to a side of the second base 20 where the insulating layer 201 and the semiconductor layer 202 are arranged. Apparently, the present disclosure is not limited thereto.

Specifically, before attaching and fixing the side of the first substrate 1 where the conductive layer 11 is arranged to the side of the second base 20, the method further includes: forming a first opening 3 in a region on a surface of the side of the first substrate 1 where the conductive layer 11 is arranged and/or the side of the second base 20, so that the first opening 3 between the first substrate 1 and the second substrate 2 which are attached and fixed together forms a cavity 30. In the embodiment, only a case where the first opening 3 is formed on a side of the second substrate 2 where the insulating layer 201 and the semiconductor layer 202 are arranged is taken as an example for illustration, referring to FIG. 13.

Figure 15:
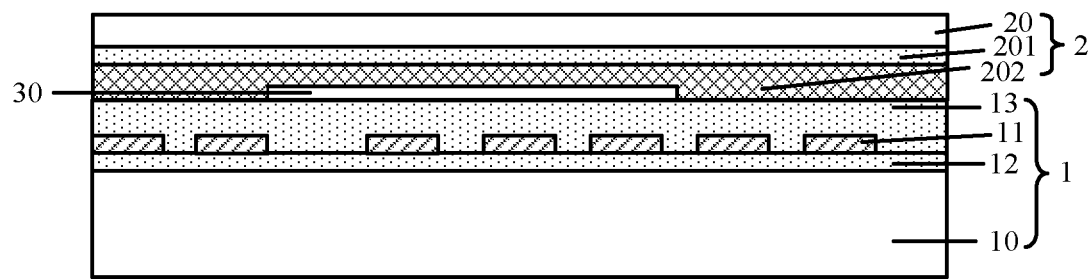

Referring to FIG. 15, a side of the second base 20 facing away from the first substrate 1 is thinned by removing entirely or a part of the second base 20 in a thickness direction, so as to form a deformable mechanical film. In the embodiment, only a case where a part of the second base 20 in the thickness direction is removed is taken as an example for illustration. However, the present disclosure is not limited thereto.

The use of SOI substrate leads to a simple process of thinning the second substrate 2 after attaching and fixing the first substrate 1 to the second substrate 2, thereby simplifying the process flow. Also, the semiconductor layer 202 may further serve as a mechanical support film for the piezoelectric capacitor, thereby providing a good and stable mechanical structure for the transducer.

Figure 16:
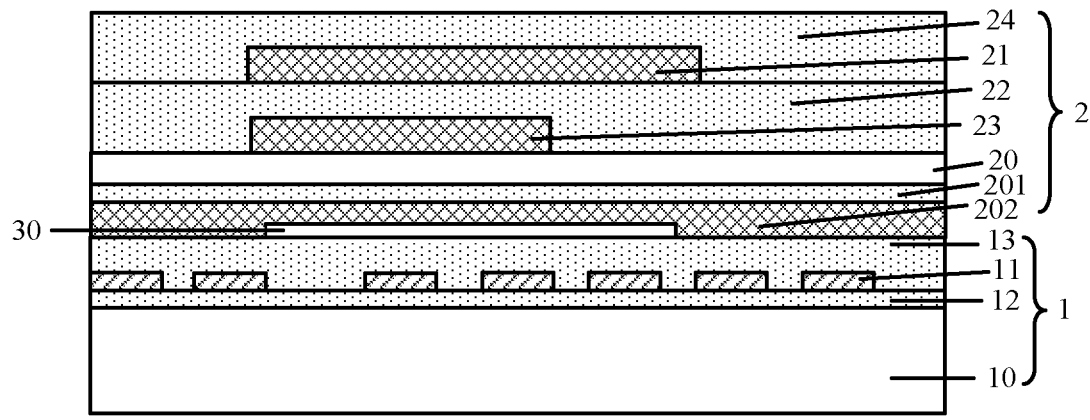

Referring to FIG. 16, a piezoelectric capacitor is formed on the side of the second substrate facing away from the first substrate 1. The piezoelectric capacitor includes a second electrode 23, the piezoelectric layer 22 and the first electrode 21, and a position of the piezoelectric capacitor corresponds to a position of the cavity 30. In addition, in an embodiment, a protection layer 24 may be formed on the first electrode, so as to protect the first electrode 21 and prevent the first electrode 21 from electrical leakage.

In the embodiment, the second electrode 23, the piezoelectric layer 22, the first electrode 21 and the protection layer 24 may be formed by a deposition process. The second electrode 23, the piezoelectric layer 22 and the first electrode 21 are made of the same materials as those in the aforementioned embodiment, and are not repeated here. A material of the protection layer 24 includes an insulating material.

In the embodiment, only a case where the MEMS piezoelectric transducer includes one piezoelectric capacitor formed by the first electrode 21, the piezoelectric layer 22 and the second electrode 23 is taken as an example for illustration. However, the present disclosure is not limited thereto, and the MEMS piezoelectric transducer may include multiple piezoelectric capacitors described above in another embodiment.

In another embodiment, the method further includes: forming a first bonding layer 13 on the surface of the side of the first substrate 1 where the conductive layer 11 is arranged and/or forming a second bonding layer on a surface of the side of the second substrate 2, where the first substrate 1 and the second substrate 2 are attached and fixed together through the first bonding layer 13 and/or the second bonding layer. In an embodiment, at least one of the first bonding layer 13 and the second bonding layer includes an insulating structure. In the embodiment, the first bonding layer 13 and/or the second bonding layer 24 includes an insulating structure. The insulation structure may have an area corresponding to the entire first substrate or a part of the first substrate. If the insulation structure has an area corresponding to a part of the first substrate, the part of the layer corresponding to the other part of the first substrate may be conductive.

Referring to FIG. 12, the first bonding layer 13 is provided on the surface of the side of the first substrate 1 where the conductive layer 11 is arranged. The first bonding layer 13 is formed by: depositing a first bonding film on surfaces of the first dielectric layer 12 and the conductive layer 11; and planarizing the first bonding film with a chemical mechanical polishing process, to form the first bonding layer 13. In addition, in the embodiment, the second bonding layer on the second substrate 2 is the semiconductor layer 202, Since surfaces of first bonding layer 13 and the semiconductor layer 202 are planarized, the first substrate 1 and the second substrate 2 have a large contact surface area after the first substrate 1 and the second substrate 2 are attached and fixed together through the first bonding layer 13. Therefore, a stacked structure of the first substrate 1 and the second substrate 2 has great strength and stable bonding.

In the embodiment, a conductive through via for electrically connecting the first electrode 21 with the conductive layer 11 is formed by: forming a first conductive through via 25 extending from a side of the second substrate facing away from the first substrate 1 to the conductive layer 11; and forming a second conductive through via 26 extending from the side of the second substrate 2 facing away from the first substrate 1, that is, from the protection layer 24, to the first electrode 21. Referring to FIG. 7A, the second conductive through via 26 is a part of the first conductive through via 25, namely, the first conductive through via 25 and the second conductive through via 26 are electrically connected directly. Alternatively, referring to FIG. 17, the first conductive through via 25 and the second conductive through via 26 are electrically connected through a conductive connection layer/structure 27 arranged on the side of the second substrate 2 facing away from the first substrate 1.

The piezoelectric capacitor is electrically connected to the conductive layer 11, and therefore is electrically connected to the signal processing circuit and/or the driving circuit, so that the signal processing circuit receives an electrical signal outputted by the deformed piezoelectric capacitor, and/or the driving circuit outputs an electrical signal to the piezoelectric capacitor to drive the piezoelectric capacitor to be deformed.

In an embodiment, the second electrode 23 of the piezoelectric capacitor may be electrically connected to the conductive layer 11 via a conductive through via. Similarly, the conductive through via includes a third conductive through via extending from the side of the second base 20 facing away from the first substrate 1 to the conductive layer 11 and a fourth conductive through via extending from the side of the second base 20 facing away from the first substrate 1 to the second electrode 23. The third conductive through via and the fourth conductive through via may be electrically connected directly, or electrically connected through a conductive connection layer/structure arranged on the side of the second base 20 facing away from the first substrate 1.

Based on this, in a case that the transducer is a pressure-sensing device, the piezoelectric capacitor is deformed under external pressure, thereby generating a potential difference between the first electrode 21 and the second electrode 23. The signal processing circuit can acquire information such as pressure applied on the piezoelectric transducer based on a change in the potential difference outputted by the piezoelectric capacitor formed by the first electrode 21, the second electrode 23 and the piezoelectric layer 22 therebetween. In a case that the transducer is an actuator device, the driving circuit may output an electrical signal to the piezoelectric capacitor formed by the first electrode 21, the second electrode 23 and the piezoelectric layer 22 therebetween, so as to drive the first electrode 21, the second electrode 23 and the piezoelectric layer 22 therebetween to be deformed, thereby delivering information such as pressure or sound to the outside.

Figure 18:
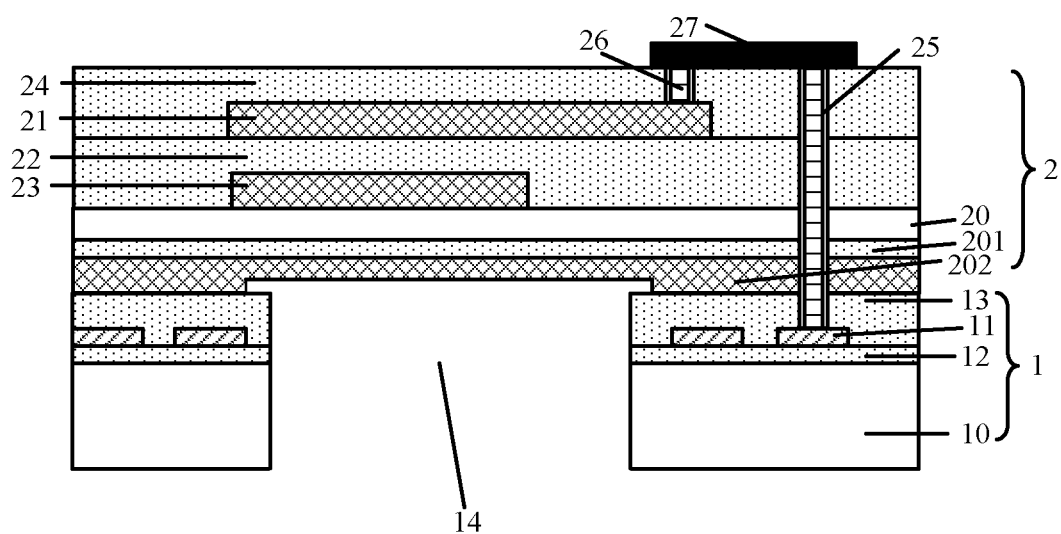
FIG. 18 is a schematic sectional structural diagram of an MEMS piezoelectric transducer including a second opening according to another embodiment of the present disclosure.

In another embodiment of the present disclosure, referring to FIG. 18, the method further includes: forming a second opening 14 on a side of the first substrate 1 facing away from the second substrate 2. A position of the second opening 14 corresponds to a position of the first electrode 21. Formation of the second opening 14 facilitates communication between the outside (underside) environment and the piezoelectric capacitor, and also facilitates deformation of the piezoelectric capacitor.

The second opening 14 is formed by: forming a patterned layer on a surface of the first substrate 1 facing away from the second substrate 2, where a position at which the second opening 14 is to be formed is exposed through the patterned layer; and etching the first substrate 1 using the patterned layer as a mask until the first substrate 1 is etched through, to form the second opening 14. The patterned layer may include a patterned photoresist layer, and an etching process may include an anisotropic dry etching process.

Figure 19:
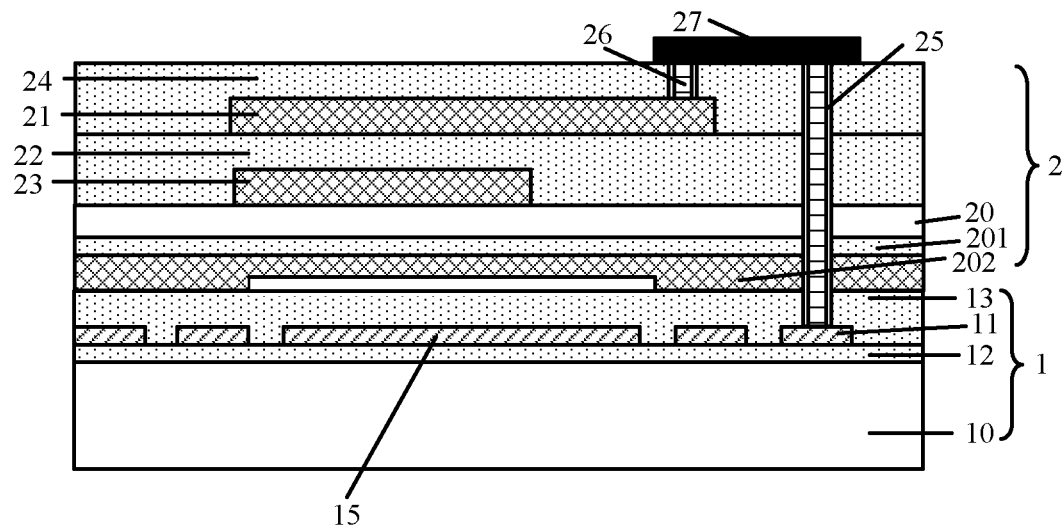
FIG. 19 is a schematic sectional structural diagram of an MEMS piezoelectric transducer including a third electrode according to another embodiment of the present disclosure.

In yet another embodiment of the present disclosure, referring to FIG. 19, a third electrode 15 is formed on the side of the first substrate 1 where the conductive layer 11 is arranged. A position of the third electrode 15 corresponds to the position of the first electrode 21. In the embodiment, the third electrode 15 is arranged in the same layer as the conductive layer 11. In another embodiment, the third electrode 15 may be arranged in a higher or lower layer than the conductive layer 11. In a case that a voltage is applied on the third electrode 15, the third electrode 15 generates an electrostatic pull on the second substrate 2, and the first electrode 21 and the piezoelectric layer 22 are deformed under the electrostatic pull. Whether the piezoelectric capacitor including the first electrode 21 and the piezoelectric layer 22 can operate normally is detected by measuring whether an output of the piezoelectric capacitor is changed under the electrostatic pull.

Figure 20:
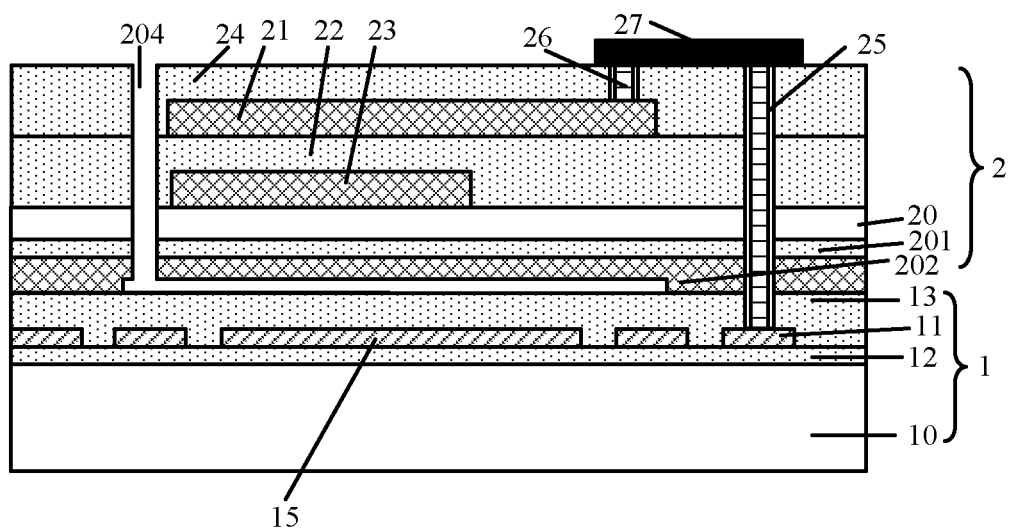
FIG. 20 is a schematic sectional structural diagram of an MEMS piezoelectric transducer including a third opening according to another embodiment of the present disclosure.

In yet another embodiment of the present disclosure, referring to FIG. 20, a third opening 204 is formed on the side of the second substrate 2 facing away from the first substrate 1. The third opening 204 extends from the side of the second substrate 2 facing away from the first substrate 1 to the cavity 30, so as to mechanically partial-release the piezoelectric capacitor structure including the first electrode 21, the piezoelectric layer 22 and the second electrode 23.

Figure 17:
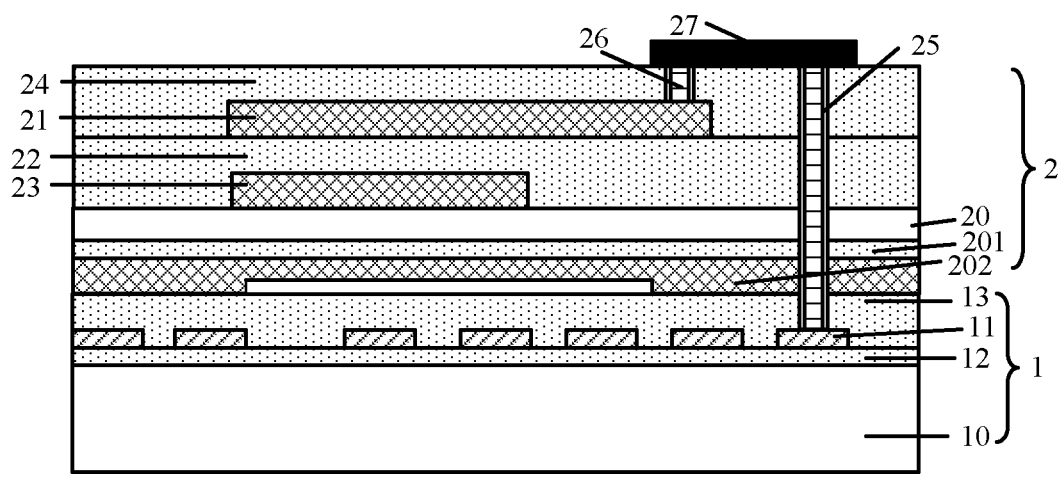

Correspondingly, an MEMS piezoelectric transducer is further provided according to an embodiment of the present disclosure, and the MEMS piezoelectric transducer can be manufactured using the MEMS piezoelectric transducer manufacturing method according to the embodiment described above. Referring to FIG. 17, the MEMS piezoelectric transducer includes a first substrate 1 and a second substrate 2 which are attached and fixed together.

The first substrate 1 includes a first base 10, at least one conductive layer 11, and a signal processing circuit and/or a driving circuit arranged on a side of the first base 10. The signal processing circuit and/or the driving circuit is electrically connected to the conductive layer 11.

The second substrate 2 includes a second base 20. A side of the second base 20 is attached and fixed to a side of the first substrate 1 where the conductive layer 11 is arranged. The second base 20 in a region of the second substrate 2 corresponding to a first electrode 21 has a zero, partial or full thickness. A piezoelectric capacitor is provided on a side of the second substrate facing away from the first substrate. The piezoelectric capacitor includes a piezoelectric layer 22, the first electrode 21 and a second electrode 23.

A position of the first electrode 21 and/or a position of the second electrode 23 correspond to a position of a cavity 30. The first electrode 21 is electrically connected to the conductive layer 11 via a conductive through via, so that the piezoelectric capacitor is electrically connected to the signal processing circuit and/or the driving circuit. In the embodiment, the second electrode 23 corresponds to the first electrode 21, and a protection layer 24 is provided on the first electrode 21.

In the embodiment, the conductive through via includes a first conductive through via 25 and a second conductive through via 26. The first conductive through via 25 extends from a side of the second base 20 facing away from the first substrate 1, that is, from the protection layer 24, to the conductive layer 11, and the second conductive through via 26 extends from the side of the second base 20 facing away from the first substrate 1, that is, from the protection layer 24, to the first electrode 21. The second conductive through via 26 may be a part of the first conductive through via 25, that is, the first conductive through via 25 and the second conductive through via 26 are electrically connected directly. Alternatively, the first conductive through via 25 and the second conductive through via 26 are electrically connected through a conductive connection layer/structure 27 arranged on a surface of the side of the second base 20 facing away from the first substrate 1.

The first substrate 1 further includes a first bonding layer 13 arranged on a surface of a side of the first base 10 where the conductive layer 11 is arranged, and/or the second substrate further includes a second bonding layer on a surface of the side of the second base 20. The first substrate 1 and the second substrate 2 are attached and fixed together through the first bonding layer 13 and/or the second bonding layer. In an embodiment, at least one of the first bonding layer 13 and the second bonding layer includes an insulating structure. In the embodiment, the first bonding layer 13 and/or the second bonding layer 24 includes an insulating structure. The insulation structure may have an area corresponding to the entire first substrate or a part of the first substrate. If the insulation structure has an area corresponding to a part of the first substrate, the part of the layer corresponding to the other part of the first substrate may be conductive.

In another embodiment of the present disclosure, a first opening 3 is provided on the side of the first substrate 1 where the conductive layer 11 is arranged and/or the side of the second base 20, and the first opening 3 between the first substrate 1 and the second substrate 2 forms a cavity 30.

In another embodiment of the present disclosure, referring to FIG. 18, a second opening 14 is provided on a side of the first substrate 1 facing away from the second substrate 2. A position of the second opening 14 corresponds to a position of the piezoelectric capacitor.

In another embodiment of the present disclosure, referring to FIG. 19, a third electrode 15 is provided on the side of the first substrate 1 where the conductive layer 11 is arranged.

The third electrode 15 is a self-test electrode, and a position of the third electrode 15 corresponds to the position of the piezoelectric capacitor.

In yet another embodiment of the present disclosure, referring to FIG. 20, a third opening 204 is formed on the side of the second substrate 2 facing away from the first substrate 1. The third opening 204 extends from the side of the second substrate 2 facing away from the first substrate 1 to the cavity 30, so as to mechanically partial-release the piezoelectric capacitor structure including the first electrode 21, the piezoelectric layer 22, and the second electrode 23.

In the MEMS piezoelectric transducer and the method for manufacturing the MEMS piezoelectric transducer according to the embodiments of the present disclosure, the first substrate includes the first base, at least one conductive layer and the signal processing circuit and/or the driving circuit arranged on the side of the first base. The signal processing circuit and/or the driving circuit is electrically connected to the conductive layer. The second substrate includes the second base. The side of the second base is attached and fixed to the side of the first substrate where the conductive layer is arranged. The piezoelectric layer, the first electrode and the second electrode are provided on the side of the second base facing away from the first substrate. The first electrode is electrically connected to the conductive layer through the conductive through via, and therefore is electrically connected to the signal processing circuit and/or the driving circuit, so that the signal processing circuit may receive an electrical signal outputted by the electrode of the deformed piezoelectric capacitor, and/or the driving circuit may output an electrical signal to the electrode of the piezoelectric capacitor to deform the piezoelectric layer. That is, in the embodiment of the present disclosure, a direct piezoelectric effect and a converse piezoelectric effect can be applied to the piezoelectric transducers by electrically connecting and integrating the piezoelectric capacitor formed by the first electrode, the second electrode and the piezoelectric layer with the signal processing circuit and/or the driving circuit.

Based on this, a stacked structure of the first substrate and the second substrate is formed by attaching and fixing the side of the first substrate where the conductive layer is arranged to the side of the second base and forming the piezoelectric layer, the first electrode and the second electrode on the side of the second base facing away from the first substrate. The cavity corresponding to the first electrode is formed between the first substrate and the second substrate. The cavity is formed easily, which provides space for deformation of the first electrode and the piezoelectric layer. Also, in the embodiment, a base material may be provided for forming the piezoelectric capacitor (including the first electrode, the piezoelectric layer, the second electric and the like), therefore solving the problem of poor performance of the MEMS piezoelectric transducer resulting from the constraints of the signal processing circuit and/or the subsequent driving circuit, and reducing a process difficulty. Therefore, materials and manufacturing processes of the second base and the piezoelectric capacitor can be selected freely. The transducer may have a good and stable mechanical structure by means of material selection of the second base, and the formed piezoelectric transducer has good performance.

The embodiments of the present disclosure are described in a progressive manner, and each embodiment is focused on describing differences from other embodiments. And references may be made one to another with respect to the same or similar parts among the embodiments. Since the device in the embodiments corresponds to the method in the embodiments, the description for the device is simple, and reference may be made to the description of the method in the embodiment for relevant matters.

Based on the above description of the embodiments, those skilled in the art can implement or use the present disclosure. Numerous modifications to the embodiments are apparent to those skilled in the art, and the general principles defined herein can be implemented in other embodiments without deviating from the spirit or scope of the present disclosure. Therefore, the present disclosure is not limited to the embodiments described herein, but conforms to the widest scope consistent with the principles and novel features disclosed herein.

The invention claimed is:

1. A method for manufacturing a micro-electro-mechanical system (MEMS) piezoelectric transducer, comprising:
    preparing a first substrate comprising a first base, at least one conductive layer, and a signal processing circuit and/or a driving circuit, wherein the at least one conductive layer, the signal processing circuit and/or the driving circuit are arranged on a side of the first base;
    preparing a second substrate;
    forming a first electrode on a side of the second substrate and forming a piezoelectric material layer on the first electrode;
    bonding a side of the first substrate where the at least one conductive layer is arranged to a side of the second substrate to form a substrate bonding interface, wherein a cavity corresponding to the first electrode is provided between the first substrate and the second substrate; and
    forming a conductive through via for electrically connecting the first electrode with the at least one conductive layer.

2. The method according to claim 1, wherein a second electrode is provided on the piezoelectric layer or in the at least one conductive layer, and the second electrode corresponds to the first electrode.

3. The method according to claim 1, further comprising:
    forming a first bonding layer on the side of the first substrate where the at least one conductive layer is arranged or on a side of the second substrate facing the first substrate, wherein
    the first substrate and the second substrate are bonded together through the first bonding layer; and
    the first bonding layer comprises an insulating structure.

4. The method according to claim 1, further comprising:
    forming a first bonding layer on the side of the first substrate where the at least one conductive layer is arranged, and
    forming a second bonding layer on a side of the second substrate facing the first substrate, wherein
    the first substrate and the second substrate are bonded together through the first bonding layer and the second bonding layer, and
    at least one of the first bonding layer and the second bonding layer comprises an insulating structure.

5. The method according to claim 1, wherein the forming the conductive through via for electrically connecting the first electrode with the at least one conductive layer comprises:
    forming a first conductive through via extending from a side of the second substrate facing away from the first substrate to the at least one conductive layer; and
    forming a second conductive through via extending from the side of the second substrate facing away from the first substrate to the first electrode, wherein the first conductive through via and the second conductive through via are electrically connected directly, or the first conductive through via and the second conductive through via are electrically connected through a conductive connection structure arranged on the side of the second substrate facing away from the first substrate.

6. The method according to claim 1, before the bonding a side of the first substrate where the at least one conductive layer is arranged to a side of the second substrate, further comprising:
    forming a first opening on the side of the first substrate where the at least one conductive layer is arranged and/or a side of the second substrate facing the first substrate, wherein
    the first opening forms a cavity between the first substrate and the second substrate after the first substrate and the second substrate are bonded together.

7. The method according to claim 1, further comprising:
    forming a second opening on a side of the first substrate facing away from the second substrate, wherein a position of the second opening corresponds to a position of the first electrode.

8. The method according to claim 1, wherein the second substrate comprises a base, an insulating layer on a surface of the base and a semiconductor layer on a surface of the insulating layer, and the method further comprises:
    forming the first electrode using the semiconductor layer, or forming the first electrode on the semiconductor layer.

9. The method according to claim 1, further comprising:
    forming a third electrode on the side of the first substrate where the at least one conductive layer is arranged, wherein the third electrode is a self-test electrode, and a position of the self-test electrode corresponds to the position of the first electrode.

10. The method according to claim 1, further comprising:
    forming a third opening extending from a side of the second substrate facing away from the first substrate to the cavity.

11. The method according to claim 1, wherein
    the operation of forming a first electrode on a side of the second substrate and forming a piezoelectric material layer on the first electrode is performed before the operation of bonding a side of the first substrate where the at least one conductive layer is arranged to a side of the second substrate, wherein the side of the first substrate where the at least one conductive layer is arranged is bonded to the side of the second substrate where the first electrode and the piezoelectric material layer are formed; or
    the operation of forming a first electrode on a side of the second substrate and forming a piezoelectric material layer on the first electrode is performed after the operation of bonding a side of the first substrate where the at least one conductive layer is arranged to a side of the second substrate, wherein the side of the first substrate where the at least one conductive layer is arranged is bonded to a side of the second substrate opposite to the side where the first electrode and the piezoelectric material layer are formed.

12. A micro-electro-mechanical system (MEMS) piezoelectric transducer, comprising:
    a first substrate and a second substrate, wherein
    the first substrate comprises a first base, at least one conductive layer, a signal processing circuit and/or a driving circuit, wherein the at least one conductive layer, the signal processing circuit and/or the driving circuit are arranged on a side of the first base;
a first electrode is formed on a side of the second substrate and a piezoelectric layer is arranged on the first electrode;
a side of the first substrate where the at least one conductive layer is arranged is bonded to a side of the second substrate to form a substrate bonding interface;
a cavity corresponding to the first electrode is provided between the first substrate and the second substrate; and
a conductive through via for electrically connecting the first electrode with the at least one conductive layer is provided.

13. The MEMS piezoelectric transducer according to claim 12, wherein
the first substrate further comprises a first bonding layer arranged on the side of the first substrate where the at least one conductive layer is arranged, or the second substrate further comprises a first bonding layer arranged on a side of the second substrate facing the first substrate,
the first substrate and the second substrate are bonded together through the first bonding layer; and
the first bonding layer comprises an insulating structure.

14. The MEMS piezoelectric transducer according to claim 12, wherein
the first substrate further comprises a first bonding layer arranged on the side of the first substrate where the at least one conductive layer is arranged, and the second substrate further comprises a second bonding layer arranged on the side of the second substrate facing the first substrate,
the first substrate and the second substrate are bonded together through the first bonding layer and the second bonding layer, and
at least one of the first bonding layer and the second bonding layer comprises an insulating structure.

15. The MEMS piezoelectric transducer according to claim 12, wherein
the conductive through via comprises a first conductive through via and a second conductive through via,
the first conductive through via extends from a side of the second substrate facing away from the first substrate to the at least one conductive layer, and the second conductive through via extends from the side of the second substrate facing away from the first substrate to the first electrode; and
the first conductive through via and the second conductive through via are electrically connected directly, or the first conductive through via and the second conductive through via are electrically connected through a conductive connection structure arranged on the side of the second substrate facing away from the first substrate.

16. The MEMS piezoelectric transducer according to claim 12, wherein
a first opening is provided on the side of the first substrate where the at least one conductive layer is arranged and/or on the side of the second substrate facing the first substrate, and
the first opening between the first substrate and the second substrate forms the cavity.

17. The MEMS piezoelectric transducer according to claim 12, wherein a second opening is provided on a side of the first substrate facing away from the second substrate, and a position of the second opening corresponds to a position of the first electrode.

18. The MEMS piezoelectric transducer according to claim 12, wherein
a third electrode is provided on a side of the first substrate where the at least one conductive layer is arranged, the third electrode is a self-test electrode, and a position of the third electrode corresponds to the position of the first electrode.

19. The MEMS piezoelectric transducer according to claim 12, wherein a third opening is provided on a side of the second substrate facing away from the first substrate, and the third opening extends from the side of the second substrate facing away from the first substrate to the cavity.

20. The MEMS piezoelectric transducer according to claim 12, wherein:
the side of the first substrate where the at least one conductive layer is arranged is bonded to the side of the second substrate where the first electrode and the piezoelectric material layer are formed; or
the side of the first substrate where the at least one conductive layer is arranged is bonded to a side of the second substrate opposite to the side where the first electrode and the piezoelectric material layer are formed.

21. The MEMS piezoelectric transducer according to claim 12, wherein
the second substrate comprises a second base, and the first electrode is arranged on a side of the second base; and
the distance between the second base and the first substrate is greater than the distance between the piezoelectric layer and the first substrate.

22. The MEMS piezoelectric transducer according to claim 21, wherein the second base in a region of the second substrate corresponding to the first electrode has a zero or partial thickness.

* * * * *